(12) United States Patent
Tsai et al.

(10) Patent No.: US 11,948,896 B2
(45) Date of Patent: Apr. 2, 2024

(54) PACKAGE STRUCTURE

(71) Applicant: Taiwan Semiconductor Manufacturing Company, Ltd., Hsinchu (TW)

(72) Inventors: Tsung-Fu Tsai, Changhua (TW); Kung-Chen Yeh, Taichung (TW); I-Ting Huang, Kaohsiung (TW); Shih-Ting Lin, Taipei (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 65 days.

(21) Appl. No.: 17/874,030

(22) Filed: Jul. 26, 2022

(65) Prior Publication Data

US 2022/0359430 A1    Nov. 10, 2022

Related U.S. Application Data

(60) Continuation of application No. 17/171,136, filed on Feb. 9, 2021, now Pat. No. 11,476,205, which is a
(Continued)

(51) Int. Cl.
*H01L 23/00* (2006.01)
*H01L 21/56* (2006.01)
(Continued)

(52) U.S. Cl.
CPC .......... *H01L 23/562* (2013.01); *H01L 21/563* (2013.01); *H01L 21/565* (2013.01); *H01L 21/6835* (2013.01); *H01L 21/76898* (2013.01); *H01L 21/78* (2013.01); *H01L 23/3135* (2013.01); *H01L 23/481* (2013.01); *H01L 23/544* (2013.01); *H01L 25/0657* (2013.01); *H01L 25/18* (2013.01); *H01L 25/50* (2013.01); *H01L 2221/68372* (2013.01); *H01L 2223/5446* (2013.01); *H01L 2225/06513* (2013.01); *H01L 2225/06541* (2013.01); *H01L 2225/06555* (2013.01); *H01L 2225/06586* (2013.01)

(58) Field of Classification Search
CPC ... H01L 23/562; H01L 21/563; H01L 21/565; H01L 21/78; H01L 25/50
See application file for complete search history.

(56) References Cited

U.S. PATENT DOCUMENTS 6,614,122 B1    9/2003  Dory et al.
8,952,552 B2    2/2015  Zang et al.
(Continued)

*Primary Examiner* — Thao P Le
(74) *Attorney, Agent, or Firm* — Birch, Stewart, Kolasch & Birch, LLP

(57) ABSTRACT

A package structure is provided. The package structure includes a through substrate via structure, a first stacked die package structure, an underfill layer, and a package layer. The through substrate via structure is formed over a substrate. The first stacked die package structure is over the through substrate via structure, wherein the first stacked die package structure comprises a plurality of memory dies. The underfill layer is over the first stacked die package structure. the package layer is over the underfill layer, wherein the package layer has a protruding portion that extends below a top surface of the through substrate via structure.

20 Claims, 24 Drawing Sheets

Related U.S. Application Data division of application No. 16/396,001, filed on Apr. 26, 2019, now Pat. No. 10,923,438.

(51) Int. Cl.

| | | |
|---|---|---|
| *H01L 21/683* | (2006.01) | |
| *H01L 21/768* | (2006.01) | |
| *H01L 21/78* | (2006.01) | |
| *H01L 23/31* | (2006.01) | |
| *H01L 23/48* | (2006.01) | |
| *H01L 23/544* | (2006.01) | |
| *H01L 25/00* | (2006.01) | |
| *H01L 25/065* | (2023.01) | |
| *H01L 25/18* | (2023.01) | |

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 11,152,333 B2 * | 10/2021 | Lunde .................... H01L 24/81 |
| 11,616,126 B2 * | 3/2023 | George ............. H01L 29/66977 257/14 |
| 2005/0195582 A1 | 9/2005 | Landeros et al. |
| 2009/0315162 A1 | 12/2009 | Liu et al. |
| 2009/0315163 A1 | 12/2009 | Johnson et al. |
| 2010/0193927 A1 | 8/2010 | Nishikawa et al. |
| 2011/0115083 A1 | 5/2011 | Zang et al. |
| 2012/0164791 A1 | 6/2012 | Kim et al. |
| 2013/0075895 A1 | 3/2013 | Miura et al. |
| 2018/0010771 A1 | 1/2018 | Tatsuno et al. |
| 2018/0138101 A1 | 5/2018 | Yu et al. |
| 2019/0267287 A1 | 8/2019 | Hariharan et al. |
| 2019/0326234 A1 | 10/2019 | Benson et al. |
| 2020/0006169 A1 * | 1/2020 | Warren .................... H01L 24/92 |
| 2020/0058519 A1 | 2/2020 | Tsai et al. |
| 2020/0343197 A1 | 10/2020 | Chen et al. |
| 2021/0210397 A1 | 7/2021 | Kang et al. |
| 2021/0398929 A1 | 12/2021 | Kim et al. |
| 2022/0028801 A1 | 1/2022 | Tien et al. |
| 2022/0122896 A1 | 4/2022 | Wang et al. |
| 2022/0130794 A1 | 4/2022 | Huang et al. |
| 2022/0359430 A1 * | 11/2022 | Tsai ..................... H01L 21/563 |
| 2023/0369274 A1 * | 11/2023 | Wu ......................... H01L 25/50 |

\* cited by examiner

PACKAGE STRUCTURE

CROSS REFERENCE TO RELATED APPLICATIONS

This application is a Continuation Application of U.S. patent application Ser. No. 17/171,136, filed on Feb. 9, 2021, which is a Divisional of U.S. Pat. No. 10,923,438 B2, filed on Apr. 26, 2019, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

New packaging technologies, such as package on package (PoP), have begun to be developed, in which a top package with a device die is bonded to a bottom package, with another device die. By adopting the new packaging technologies, various packages with different or similar functions may be integrated together.

Although existing package structures and methods of fabricating package structure have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
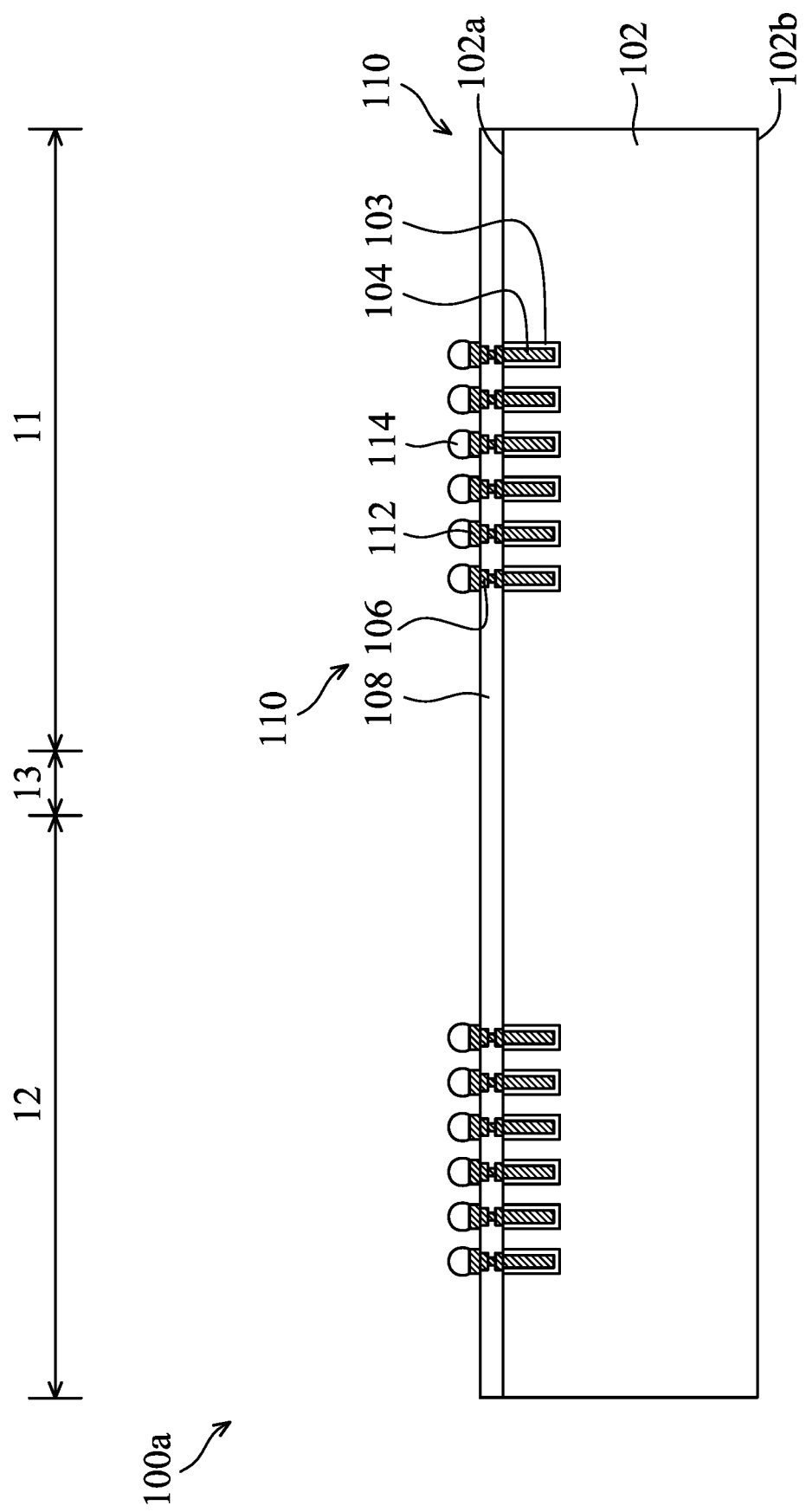
FIGS. 1A-1M show cross-sectional representations of various stages of forming a package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments for a semiconductor device structure and method for forming the same are provided. FIGS. 1A-1M show cross-sectional representations of various stages of forming a package structure 100a, in accordance with some embodiments of the disclosure. The memory dies are stacked over a base substrate, and a trench is formed in the base substrate. When the underfill material is dispersed into the cavities between two adjacent memory dies, the excessive underfill material flows into the first trench. Since the underfill layer is divided into discrete portions by the first trench the warpage of the package structure is further reduced.

Referring to FIG. 1A, a substrate 102 is provided. The substrate 102 includes a first die region 11, a second die region 12 and a scribe line region 13 between the first die region 11 and the second die region 12. The substrate 102 includes a front surface 102a and a back surface 102b. The substrate 102 is a base die that performs as a logic circuit. The substrate 102 is a logic die to control the above stacked dies, such as memory dies (formed later).

The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A number of conductive structures 104 are formed in the substrate 102. The conductive structures 104 extend from the front surface 102a of the substrate 102 towards the back surface 102b of the substrate 102. In some embodiments, the conductive structures 104 are formed by forming a number of trenches (not shown) which extend from the front surface 102a of the substrate 102. Afterwards, a barrier layer 103 is filled into each of the trenches, and the conductive structure 104 is formed on the barrier layer 103 and in each of the trenches.

An interconnect structure 110 is formed over the conductive structures 104 and the substrate 102. The interconnect structure 110 may be used as a redistribution (RDL) structure for routing. The interconnect structure 110 includes multiple conductive layers 106 formed in multiple dielectric layers 108. In some embodiments, some of the conductive layers 106 are exposed at or protruding from the top surface of the top of the dielectric layers 108. The exposed or protruding conductive layers 106 may serve as bonding pads where conductive bumps (such as tin-containing solder bumps) and/or conductive pillars (such as copper pillars) will be formed later.

The dielectric layers 108 may be made of or include one or more polymer materials. The polymer material(s) may include polybenzoxazole (PBO), polyimide (PI), one or more other suitable polymer materials, or a combination thereof. In some embodiments, the polymer material is photosensitive. In some embodiments, some or all of the dielectric layers 108 are made of or include dielectric materials other than polymer materials. The dielectric material may include silicon oxide, silicon carbide, silicon nitride, silicon oxynitride, one or more other suitable materials, or a combination thereof.

Next, an UBM layer 112 is formed over the interconnect structure 110, and a conductive connector 114 is formed over the UBM layer 112. The UBM layer 112 may be made of titanium, titanium nitride, tantalum, tantalum nitride, tungsten, titanium tungsten, nickel, gold, chrome, copper, copper alloy, another suitable material, or a combination thereof. The conductive connector 114 may be made of copper, a copper alloy, or another suitable material.

Figure 1B:
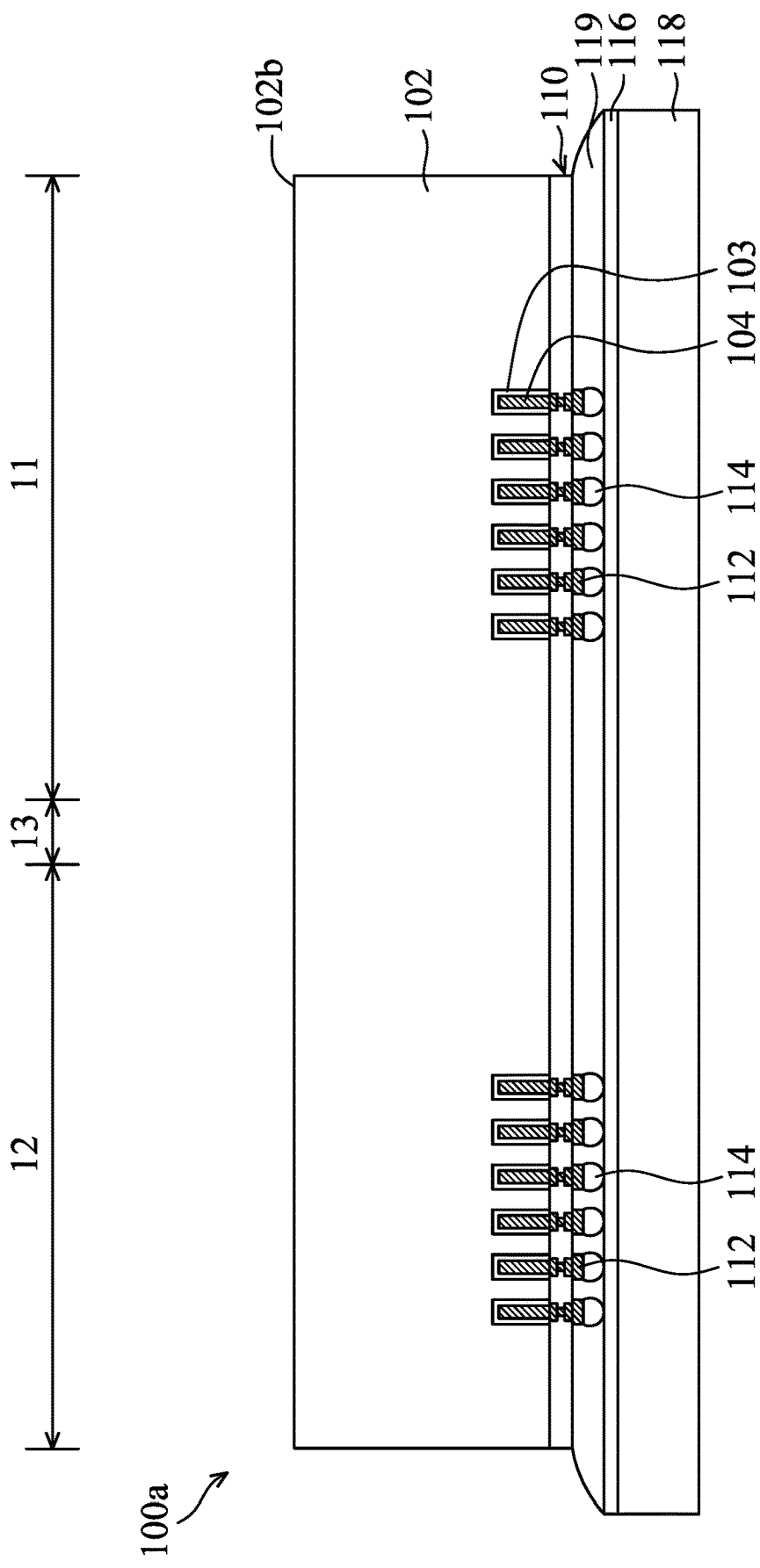

Afterwards, as shown in FIG. 1B, the substrate 102 is attached to a carrier substrate 118 through an adhesive layer 116, in accordance with some embodiments of the disclosure. Afterwards, a protection glue 119 is formed between the interconnect structure 110 and the carrier substrate 118. The protection glue 119 is used to protect the conductive connector 114 from being damaged during subsequent processing steps.

The adhesive layer 116 is used as a temporary adhesive layer. The adhesive layer 116 may be glue or a tape. In some embodiments, the adhesive layer 116 is photosensitive and is easily detached from the carrier substrate 118 by light irradiation. For example, shining ultra-violet (UV) light or laser light on the carrier substrate 118 is used to detach the adhesive layer. In some embodiments, the adhesive layer 116 is a light-to-heat-conversion (LTHC) coating. In some other embodiments, the adhesive layer 116 is heat-sensitive and is easily detached from the carrier substrate 118 when it is exposed to heat.

The carrier substrate 118 is configured to provide temporary mechanical and structural support during subsequent processing steps. The carrier substrate 118 includes glass, silicon oxide, aluminum oxide, metal, a combination thereof, and/or the like. The carrier substrate 118 includes a metal frame, in accordance with some embodiments.

Figure 1C:
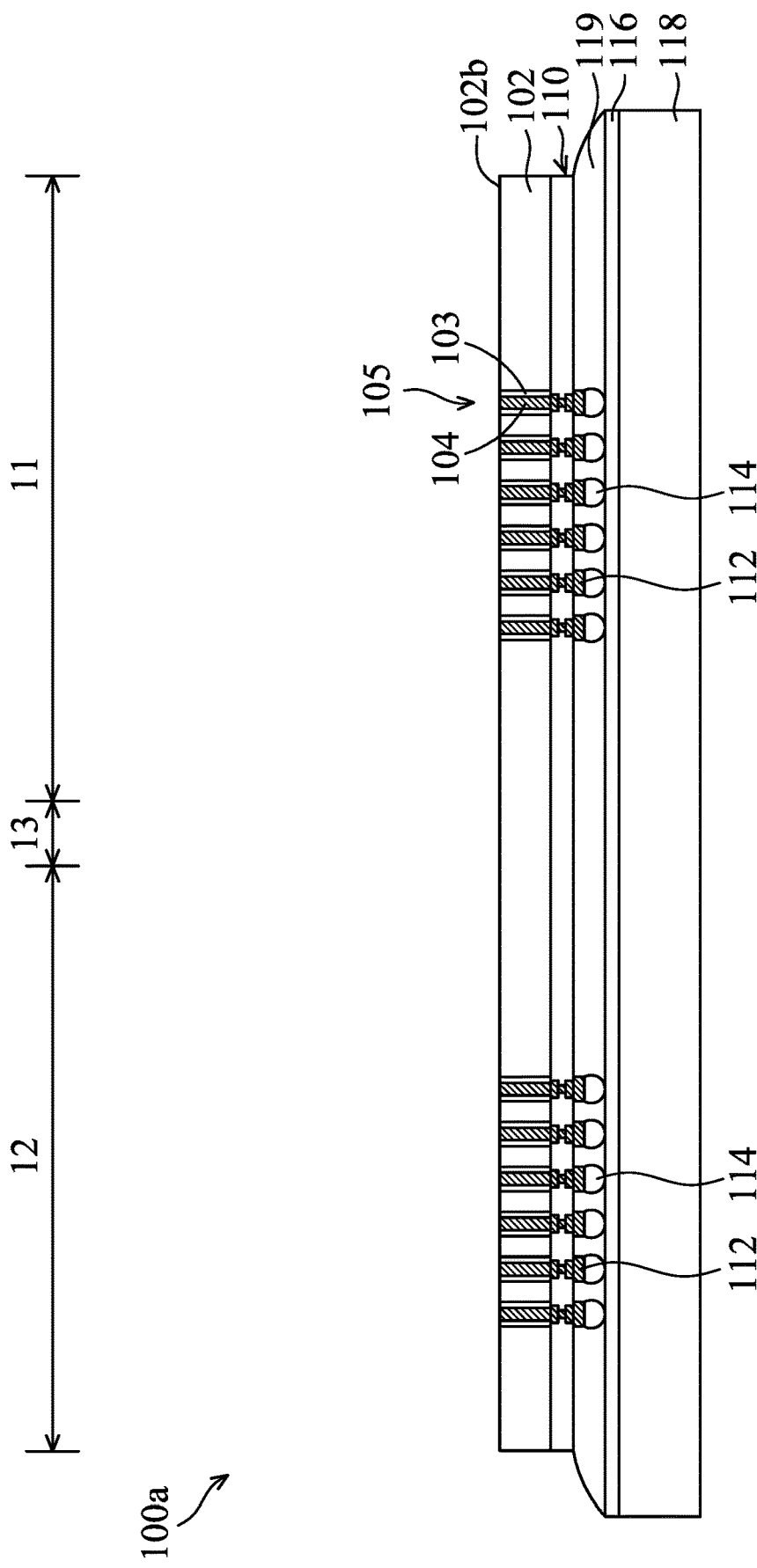

Next, as shown in FIG. 1C, the substrate 102 is thinned using the carrier substrate 118 as support, in accordance with some embodiments of the disclosure. In some embodiments, the substrate 102 is thinned from the back surface 102b until the conductive structures 104 are exposed. As a result, through-substrate via (TSV) structures 105 are formed in the substrate 102. The TSV structures 105 may be referred to as through-silicon vias.

In some embodiments, the substrate 102 is thinned using a planarization process. The planarization process may include a chemical mechanical polishing (CMP) process, a grinding process, an etching process, another applicable process, or a combination thereof.

Figure 1D:
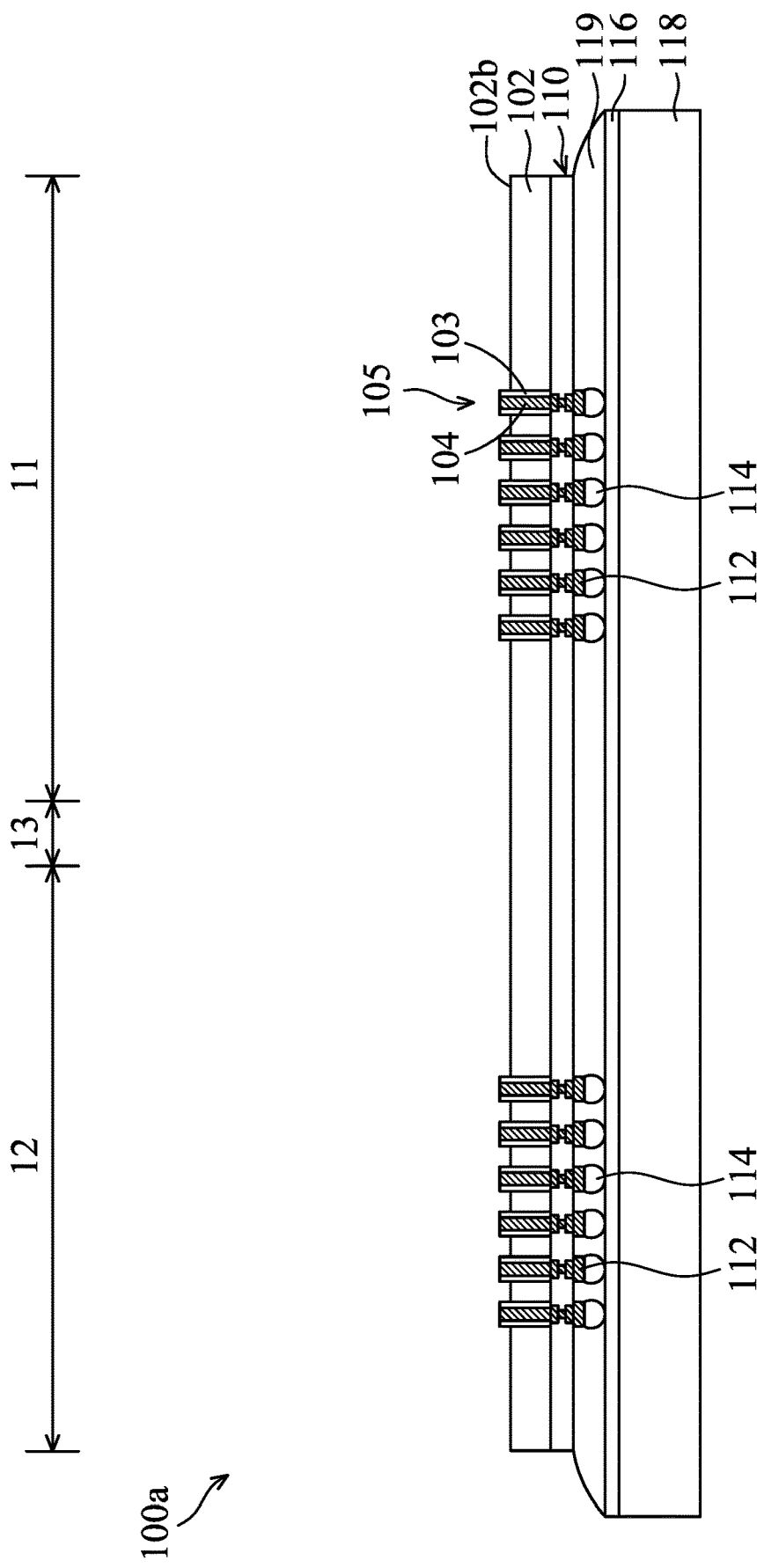

Subsequently, as shown in FIG. 1D, the substrate 102 is further thinned from the back surface 102b, in accordance with some embodiments. As a result, the TSV structures 105 protrude from the substrate 102. In some embodiments, the substrate 102 is thinned using an etching process or another applicable process.

Figure 1E:
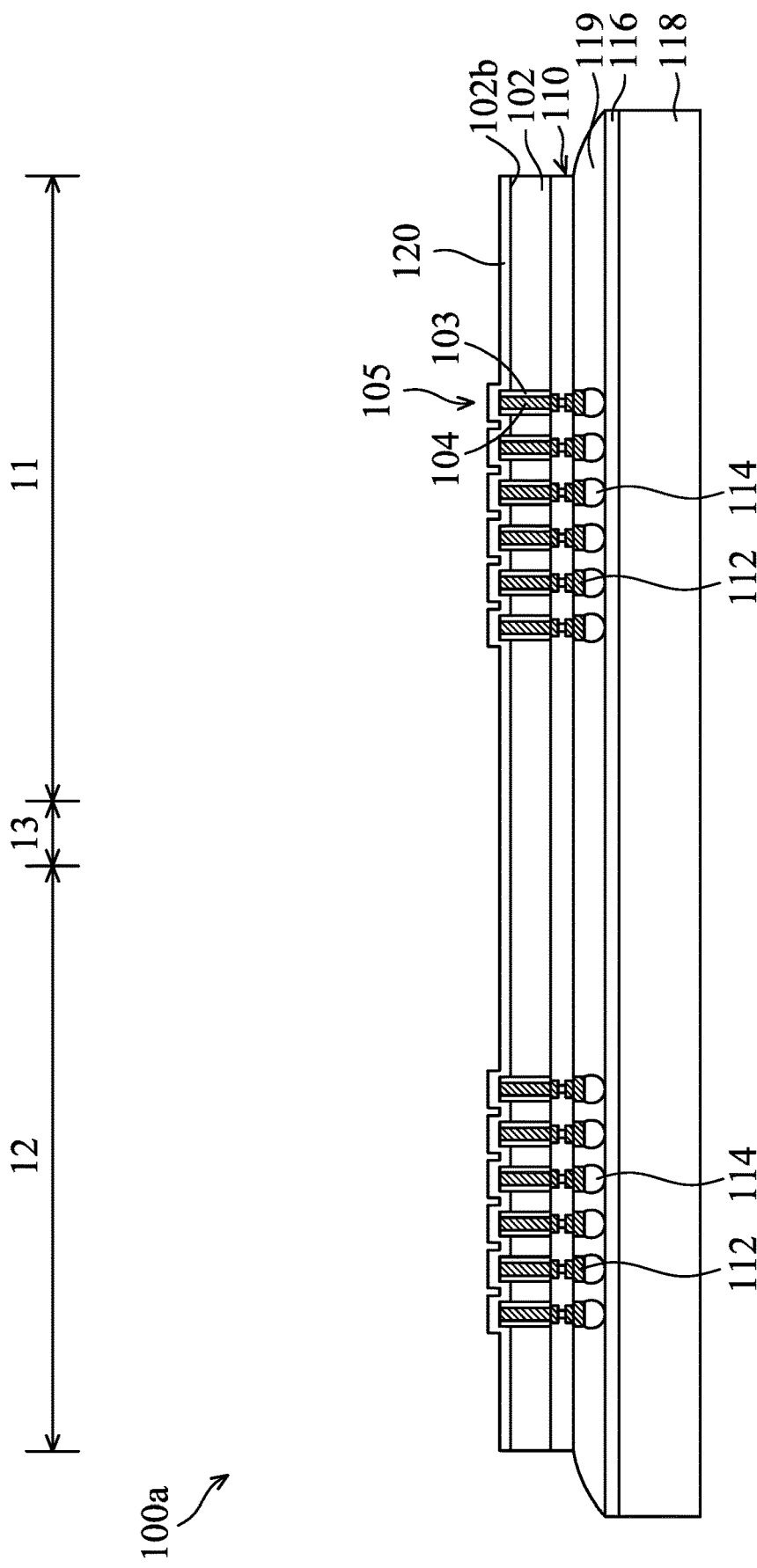

Afterwards, as shown in FIG. 1E, a passivation layer 120 is deposited over the substrate 102, in accordance with some embodiments. The passivation layer 120 surrounds protruding portions of the TSV structures 105.

In some embodiments, the passivation layer 120 is made of silicon oxide, silicon nitride, another suitable material, or a combination thereof. In some embodiments, the passivation layer 120 is deposited using a spin-on process, a chemical vapor deposition (CVD) process, another applicable process, or a combination thereof.

Figure 1F:
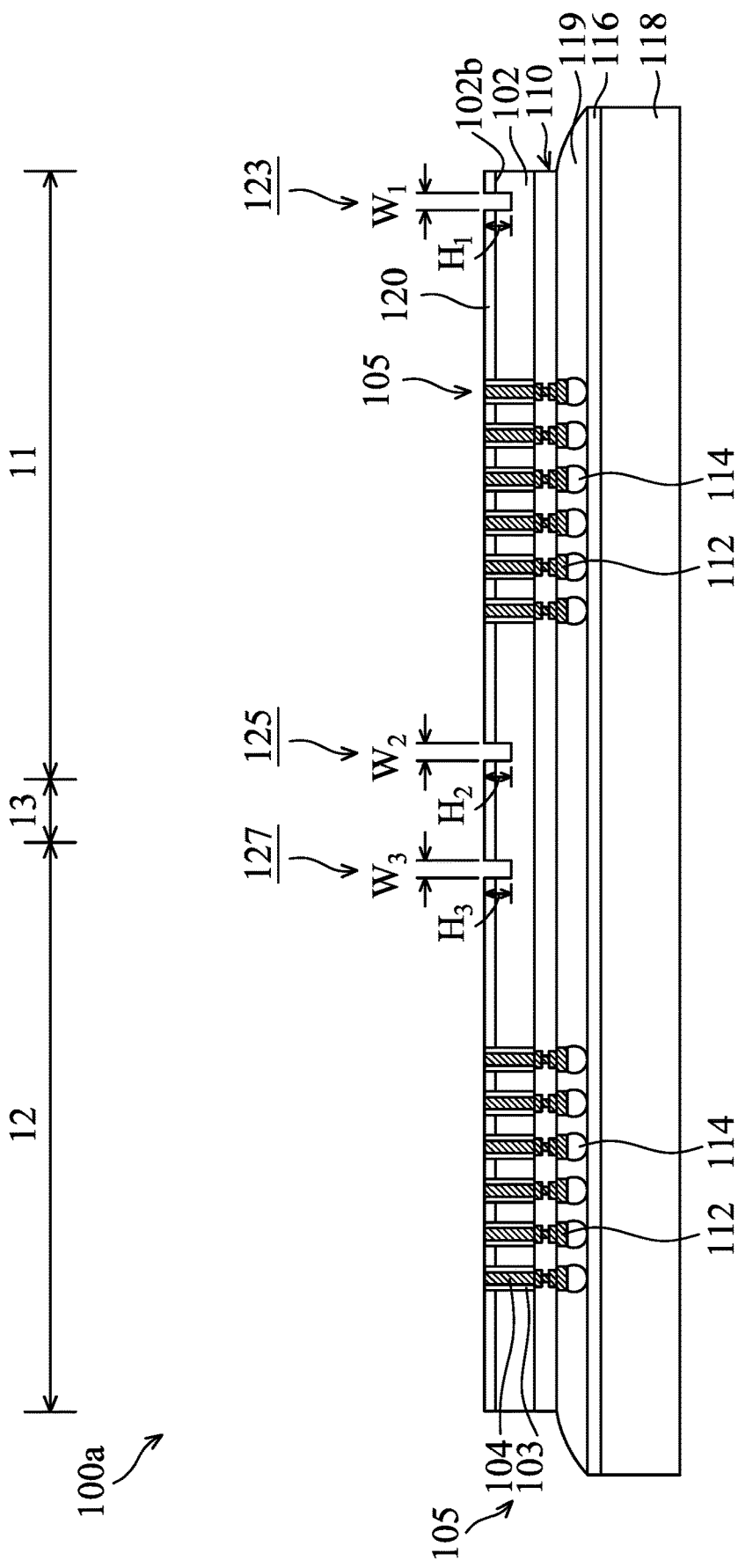

Afterwards, as shown in FIG. 1F, a planarization process is performed over the deposited passivation layer 120 to expose the TSV structures 105, in accordance with some embodiments.

Next, a first trench 123 and a second trench 125 are formed in the first die region 11, and a third trench 127 is formed in the second die region 12. The first trench 123, the second trench 125 and the third trench 127 extend through the passivation layer 120 and extend into a portion of the substrate 102 from the back surface 102b.

The first trench 123, the second trench 125 and the third trench 127 are formed in the peripheral areas of the first die region 11 and the second die region 12, and no die will be formed directly above the first trench 123, the second trench 125 and the third trench 127. The first trench 123, the second trench 125 and the third trench 127 are configured to receive the excessive underfill material 158 (formed later, in FIG. 1I).

The first trench 123 has a first width $W_1$ in a horizontal direction and a first depth $H_1$ in a vertical direction. The second trench 125 has a second width $W_2$ in a horizontal direction and a second depth $H_2$ in a vertical direction. The third trench 127 has a third width $W_3$ in a horizontal direction and a third depth $H_3$ in a vertical direction. In some embodiments, the first width $W_1$, the second width $W_2$ or the third width $W_3$ independently is in a range from about 25 µm to about 150 µm. In some embodiments, the first depth $H_1$, the second depth $H_2$, or the third depth $H_3$ independently is in a range from about 2 µm to about 20 µm. When the widths of the first trench 123, the second trench 125 and the third trench 127 are within above-mentioned range, the underfill material 158 can be effectively blocked by the first trench 123, the second trench 125 and the third trench 127. When the depths of the first trench 123, the second trench 125 and the third trench 127 are within above-mentioned range, the first trench 123, the second trench 125 and the third trench 127 have enough space to accommodate the underfill material 158.

In some embodiments, the substrate 102 has a thickness in a range from about 40 μm to about 60 μm. In some embodiments, a ratio of the first depth $H_1$ to the thickness of the substrate 102 is in a range from about 5% to about 35%.

The planarization process may include a CMP process, a grinding process, an etching process, another applicable process, or a combination thereof. In some embodiments, the first trench 123, the second trench 125 and the third trench 127 are formed by a laser etching process. In some embodiments, the first trench 123, the second trench 125 and the third trench 127 are formed by an etching process, such as a dry etching process or a wet etching process.

Figure 1G:
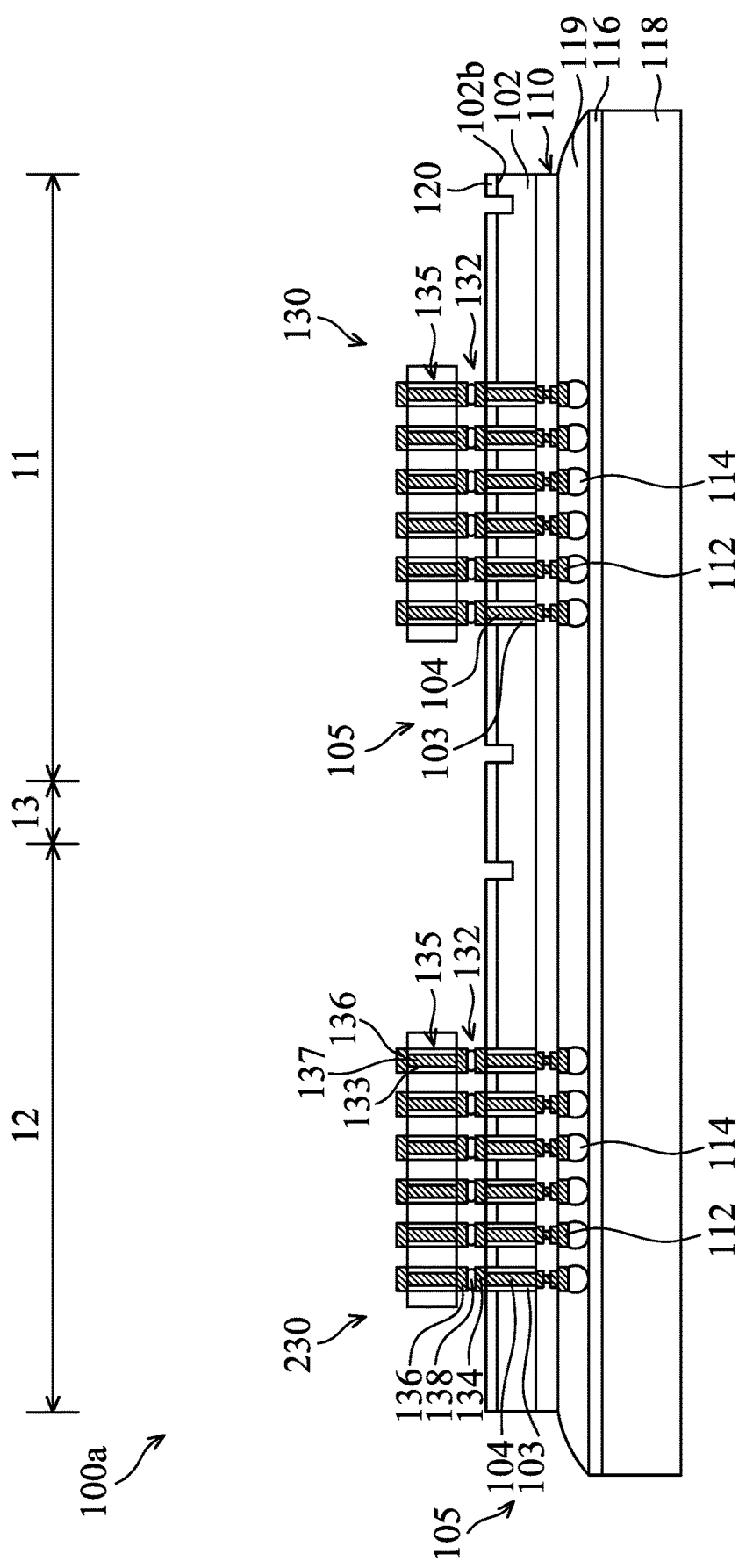

Afterwards, as shown in FIG. 1G, a first memory die 130 is formed over the substrate 102 in the first die region 11, and a second memory die 230 is formed over the substrate 102 in the second die region 12, in accordance with some embodiments. The first die 130 and the second die 230 are sawed from a wafer, and may be a "known-good-die". In some embodiments, the first die 130 and the second die 230 are memory dies. The first die 130 and the second die 230 may include static random access memory (SRAM) devices, dynamic random access memory (DRAM) devices, high bandwidth memory (HBM) or another memory dies.

The first die 130 and the second die 230 are bonded to the substrate 102 through a bonding structure 132. The bonding structure 132 includes a first conductive connector 134, a second conductive connector 136 and a solder joint 138 between the first conductive connector 134 and the second conductive connector 136.

The first conductive connector 134 is formed over the TSV structure 105, and a first solder layer (not shown) is formed over the first conductive connector 134. The second conductive connector 136 is formed below the first die 130, and a second solder layer (not shown) is formed below the second conductive connector 136. The first conductive connector 134 is bonded to the second conductive connector 136 by performing a reflow process. Next, the first solder layer and the second solder layer are melted and reshaped to together form the solder joint 138. In some embodiments, an intermetallic compound (IMC) (not shown) is formed between the solder joint 138 and the first conductive connector 134, the second conductive connector 136.

A number of through substrate via (TSV) structures 135 are formed in the first die 130 and the second die 230. The TSV structures 135 are electrically connected to the TSV structures 105 by the bonding structure 132. Each of the TSV structures 135 includes a conductive structure 137 and a barrier layer 133 surrounding the conductive structure 137. Each of the TSV structure 135 of the dies is electrically connected to the corresponding through substrate via (TSV) structure 105 of the substrate 102.

Figure 1H:
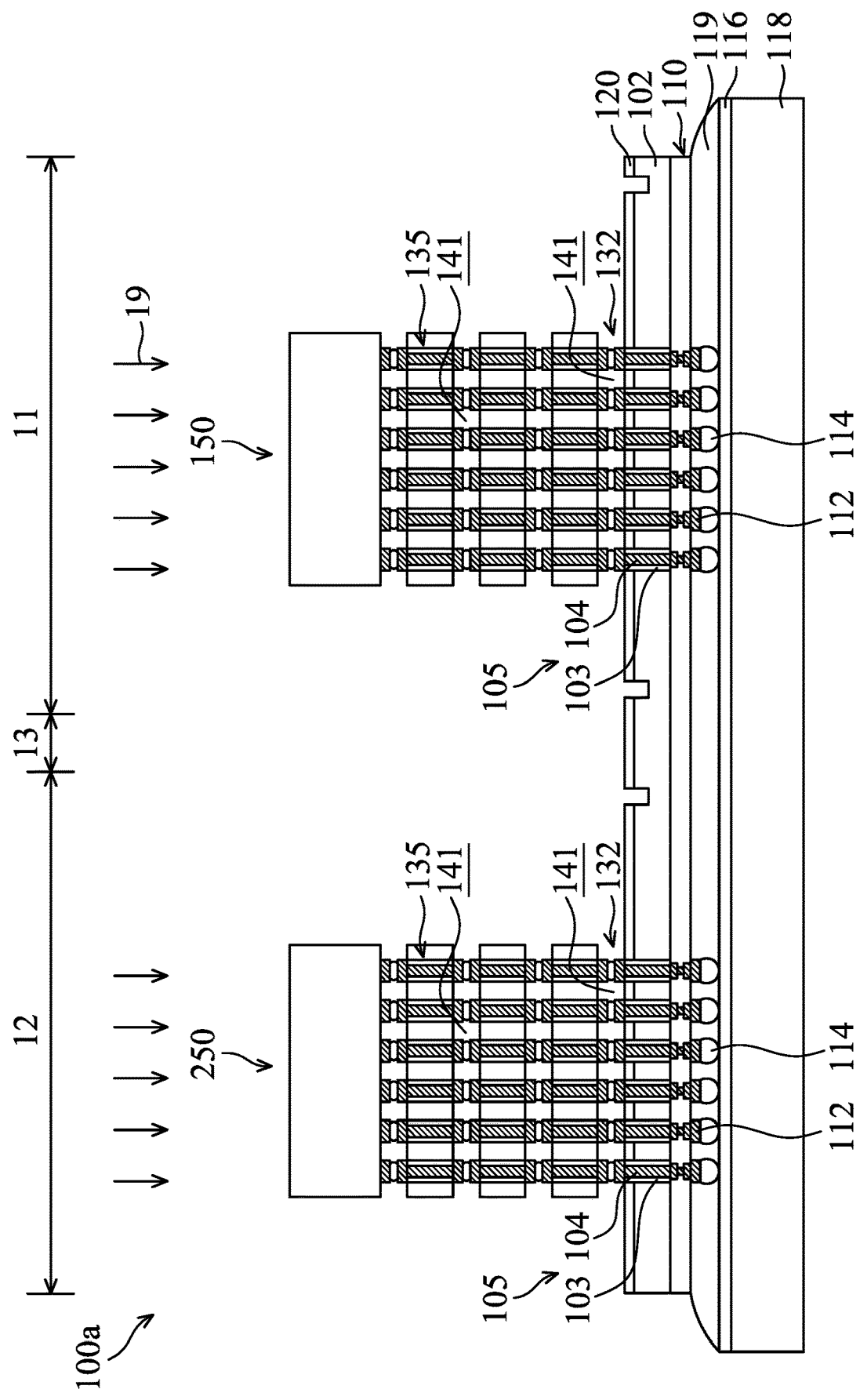

Next, as shown in FIG. 1H, a number of dies are stacked on the first die 130 and the second die 230 to form the first stacked die package structure 150 in the first die region 11 and the second stacked die package structure 250 in the second die region 12, respectively, in accordance with some embodiments. Afterwards, a reflow process 19 is performed on the first stacked die package structure 150 and the second stacked die package structure 250 to reflow and bond the bonding structure 132 between two adjacent dies (such as memory dies). As a result, the first stacked die package structure 150 is formed over the substrate 102 in the first die region 11, and the second stacked die package structure 250 is formed over the substrate 102 in the second die region 12.

In some embodiments, the reflow process 19 is a mass reflow process. In some embodiments, the reflow process (reflow stage) is operated at a temperature in a range from about 220 degrees Celsius to about 275 degrees Celsius. In some embodiments, the reflow process (reflow stage) is operated for a period of time in a range from about 60 seconds to about 120 seconds.

It should be noted that during the reflow process 19, no pressure is applied to the first stacked die package structure 150 and the second stacked die package structure 250 to prevent the excessive solder layer in the bonding structure 132 from squeezing out and avoid unwanted connection between two adjacent bonding structures 132.

In some embodiments, the first stacked die package structure 150 includes a number of memory dies. In some embodiments, the second stacked die package structure 250 includes a number of memory dies. Each of the memory dies are stacked by a number of bonding structures 132. The signal between the memory dies may be transferred through the through substrate via (TSV) structures 135 and the bonding structures 132. Each of the TSV structure 135 of the dies in the first stacked die package structure 150 or the second stacked die package structure 250 is electrically connected to the corresponding through substrate via (TSV) structure 105 of the substrate 102. The number of memory dies is not limited to four, and the number can be adjusted according to the actual application.

There are a number of cavities 141 between the adjacent dies in the first stacked die package structure 150 and in the second stacked die package structure 250. More specifically, the cavities 141 are between two adjacent bonding structures 132.

Figure 1I:
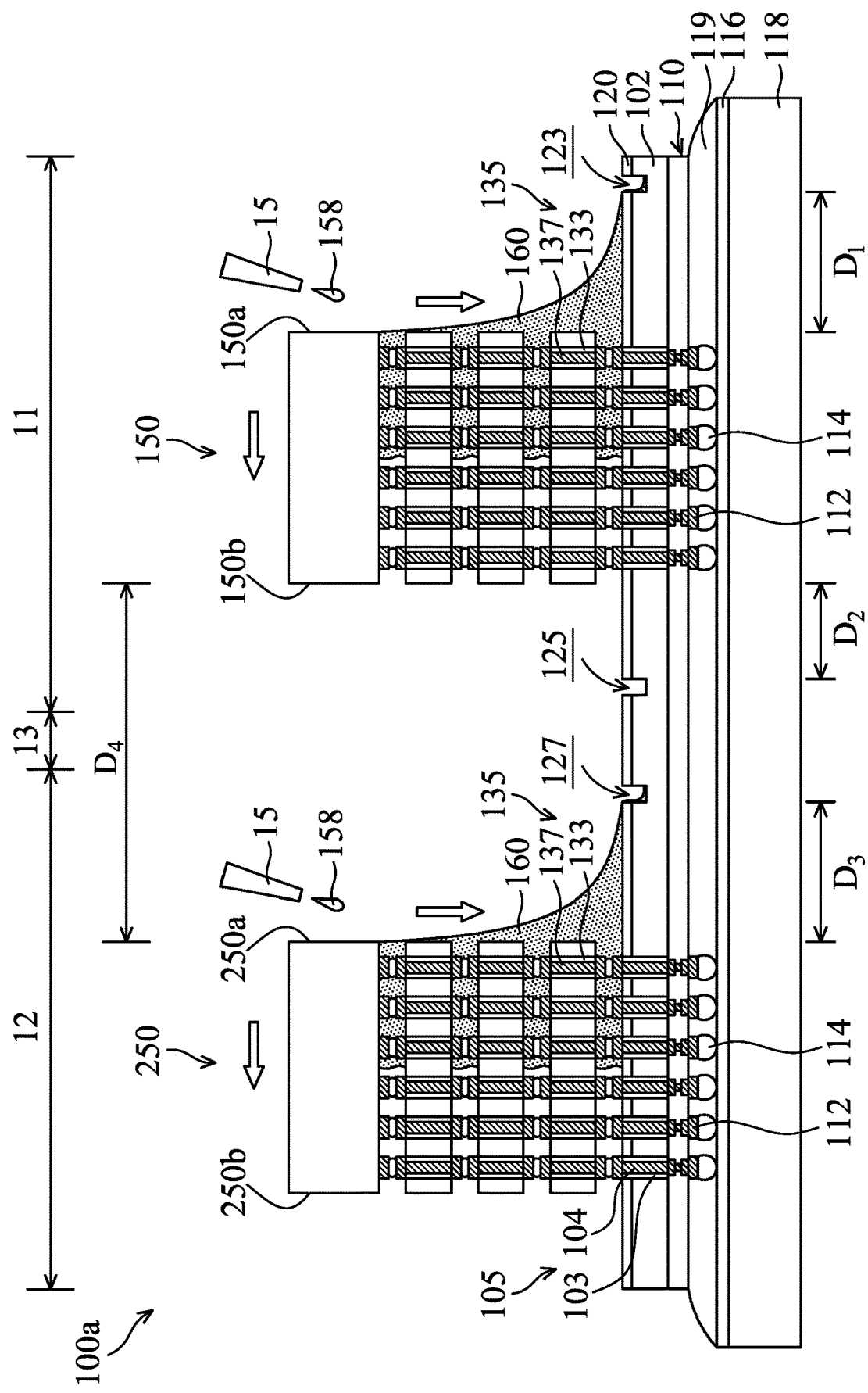

Afterwards, as shown in FIG. 1I, an underfill material 158 is dispersed from a first side 150a (the inlet end of the underfill material 158 from the nozzle 15) of the first stacked die package structure 150 by a nozzle 15, in accordance with some embodiments. In addition, the underfill material 158 is dispersed from a first side 250a (the inlet end of the underfill material 158 from the nozzle 15) of the second stacked die package structure 250 by the nozzle 15. The arrow illustrates the flow of underfill material 158. The nozzle 15 of an underfill dispensing device (not shown) is used for dispensing the underfill material 158 onto the substrate 102.

The underfill layer 160 surrounds and protects the first conductive connector 134 and the second conductive connector 136. In some embodiments, the underfill layer 160 is in direct contact with the first conductive connector 134 and the second conductive connector 136. The underfill layer 160 is between the cavities 141 to protect the bonding structures 132 between the first stacked die package structure 150, the second stacked die package structure 250 and the substrate 102.

In some embodiments, the underfill layer 160 includes an epoxy-based resin with fillers dispersed therein. The fillers may include insulating fibers, insulating particles, other suitable elements, or a combination thereof.

It should be noted that the underfill material 158 flows into the first trench 123 during the underfill material 158 flows into the cavities 141 by capillary forces. Since the second trench 125 is located at the second side 150b of the first stacked die package structure 150 and the underfill material 158 does not reach the second side 150b, and the second trench 125 is still empty. In some embodiments, a portion of the first trench 123 is filled with the underfill layer 160, but the second trench 125 is still empty since the underfill material 158 flows into the first trench 123 firstly.

In some embodiments, the first trench 123 is completely filled with the underfill layer 160. In some other embodiments, the bottom portion of the first trench 123 is filled with the underfill layer 160, but the top portion of the first trench 123 is still empty. Similar to the first trench 123, in some embodiments, the bottom portion of the third trench 127 is filled with the underfill layer 160.

There is a first distance $D_1$ between the first sidewall 150a (the inlet end of the underfill material 158 from the nozzle 15) of the first stacked die package structure 150 and the first sidewall of the first trench 123. There is a second distance $D_2$ between the second sidewall 150b (the outlet end of the underfill material 158) of the first stacked die package structure 150 and the first sidewall of the second trench 125. There is a third distance $D_3$ between the first sidewall 250a (the inlet end of the underfill material 158 from the nozzle 15) of the second stacked die package structure 250 and the first sidewall of the third trench 127. There is a fourth distance $D_4$ between the second sidewall 150b (the outlet end of flow of the underfill material 158) of the first stacked die package structure 150 and the first sidewall 250a (the inlet end of the underfill material 158 from the nozzle 15) of the second stacked die package structure 250.

Since the amount of the underfill material 158 at the inlet end is greater than the amount of the underfill material 158 at the outlet end, the tongue (or underfill fillet) region where the underfill material 158 is initially dispensed at inlet end is wider than the side region at the outlet end of the underfill material 158. In some embodiments, the second trench 125 is closer to the first stacked die package structure 150 than the first trench 123.

In some embodiments, the first distance $D_1$ is greater than the second distance $D_2$ to make the underfill material 158 flow through long path to arrive the first trench 123. Therefore, the risk of the overloading of the first trench 123 is reduced.

In some embodiments, the first distance $D_1$ is substantially equal to the third distance $D_3$. In some embodiments, the fourth distance $D_4$ is in a range from about 1000 μm to about 1200 μm. In some embodiments, the second distance $D_2$ is in a range from about 200 μm to about 300 μm. In some embodiments, the first distance $D_1$ is in a range from about 300 μm to about 400 μm. In some embodiments, a ratio of the first distance $D_1$ to the fourth distance $D_4$ is in a range from about 25% to about 40%.

Figure 1J:
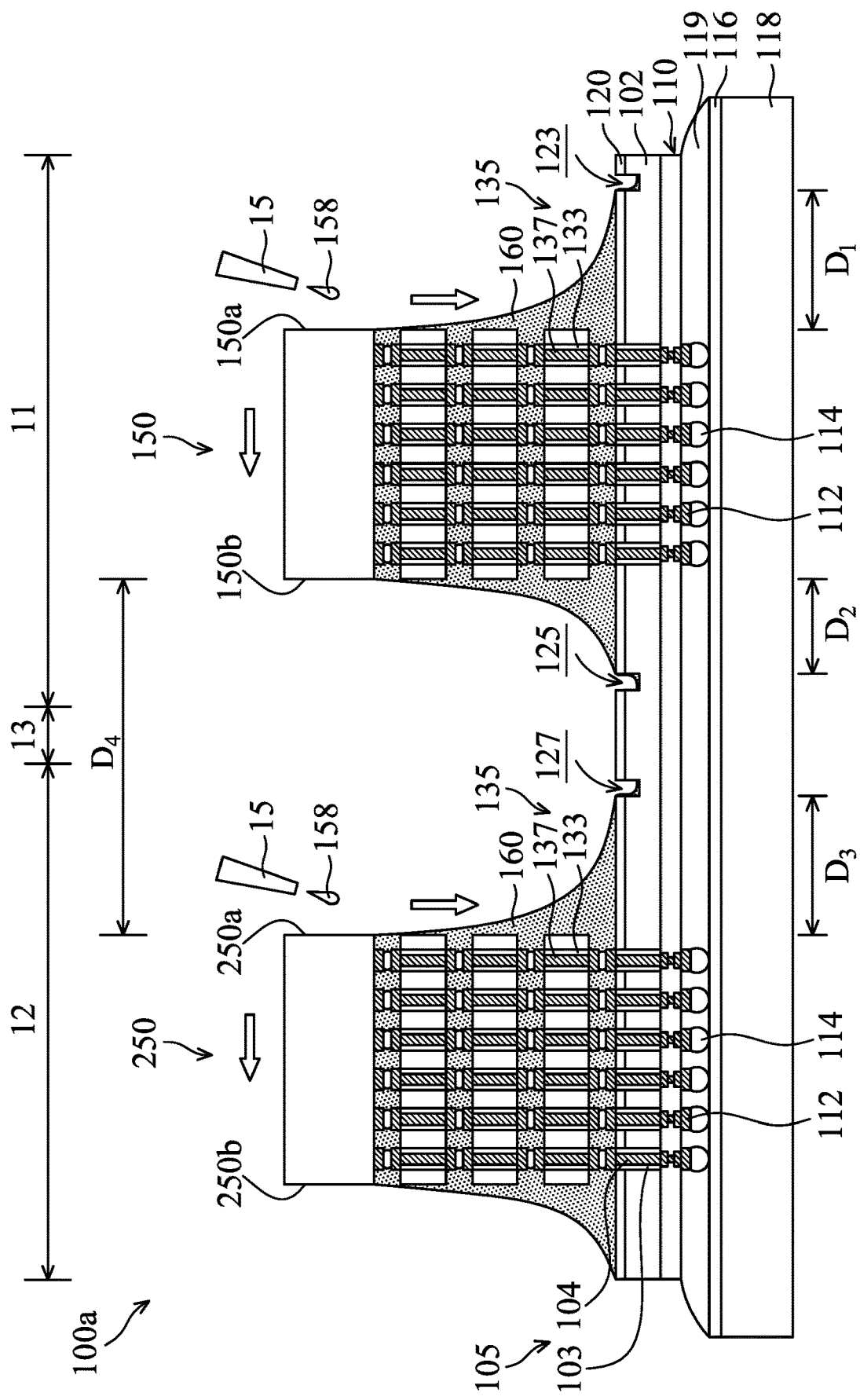

Subsequently, as shown in FIG. 1J, the underfill material 158 continues to flow from the first side 150a of the first stacked die package structure 150 to the second side 150b of the first stacked die package structure 150, in accordance with some embodiments of the disclosure. The cavities 141 are completely filled with the underfill material 158.

In some embodiments, a portion of the underfill layer 160 is formed in the bottom portion of the second trench 125. In some other embodiments, the underfill layer 160 is not formed in the second trench 125.

In some embodiments, the formation of the underfill layer 160 involves an injecting process, a spin-on process, a dispensing process, a film lamination process, an application process, one or more other applicable processes, or a combination thereof. In some embodiments, a thermal curing process is used during the formation of the underfill layer 160. In some embodiments, the curing process is operated at a temperate in a range from about 150 degrees Celsius to about 250 degrees Celsius. In some embodiments, the curing process is operated for a period of time in a range from about 10 minutes to about 10 hours.

It should be noted that since the underfill material 158 has a larger coefficient of thermal expansion (CTE) relative to the CTE of the substrate 102. In some embodiments, the CTE of the underfill material 158 is about 30 ppm/C, and the CTE of the substrate 102 is smaller than 10 ppm/C. Therefore, the warpage of the package structure 100a may occur after the curing process due to the CTE mismatch of the underfill material 158 and the substrate 102. In order to reduce or prevent warpage of the package structure 100a, the trenches 123, 125, 127 are formed in the substrate 102 to separate the underfill layer 160 into discrete portions. More specifically, the underfill bridging is block by the trenches 123, 125, 127.

As shown in FIG. 1J, the underfill layer 160 includes a first portion over the first stacked die package structure 150 in the first die region 11 and a second portion over the second stacked die package structure 250 in the second die region 12. The first portion is separated from the second portion. No underfill bridging is between the first stacked die package structure 150 and the second stacked die package structure 250. More specifically, the underfill layer 160 is not accumulated in the scribe line region 13.

The shrinkage volume of the underfill layer 160 is reduced, and therefore the warpage problem is reduced.

Figure 1K:
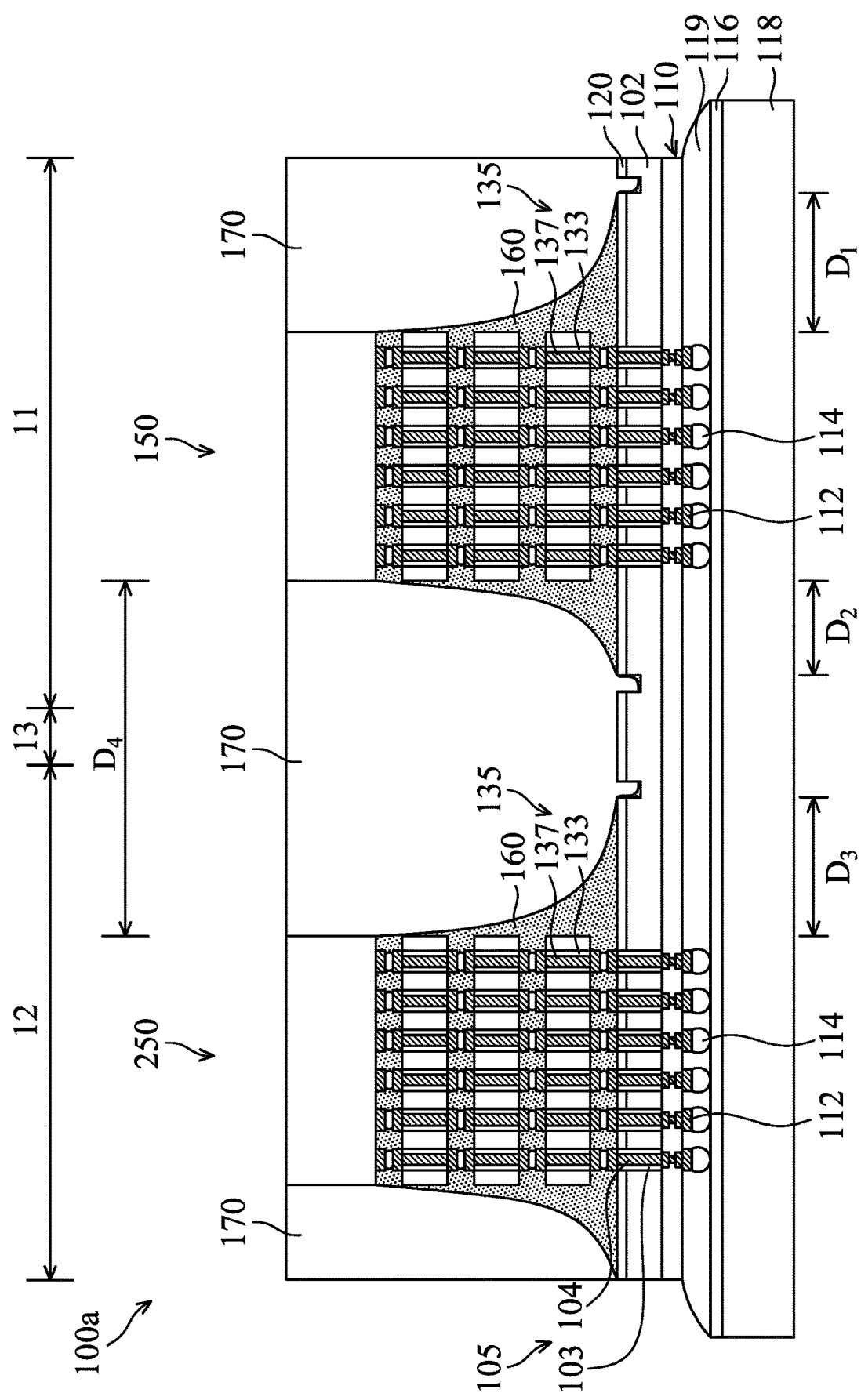

Subsequently, as shown in FIG. 1K, a package layer 170 is formed over the underfill layer 160, in accordance with some embodiments of the disclosure. There is an interface between the underfill layer 160 and the package layer 170. The package layer 170 surrounds and protects the first stacked die package structure 150 and the second stacked die package structure 250. The package layer 170 is between separated first portion and the second portion of the underfill layer 160.

The package layer 170 is made of a molding compound material. The molding compound material may include a polymer material, such as an epoxy-based resin with fillers dispersed therein. In some embodiments, a liquid molding compound material is applied over the first stacked die package structure 150 and the second stacked die package structure 250. The liquid molding compound material may flow into a space between the first stacked die package structure 150 and the second stacked die package structure 250. A thermal process is then used to cure the liquid molding compound material and to transform it into the package layer 170.

Figure 1L:
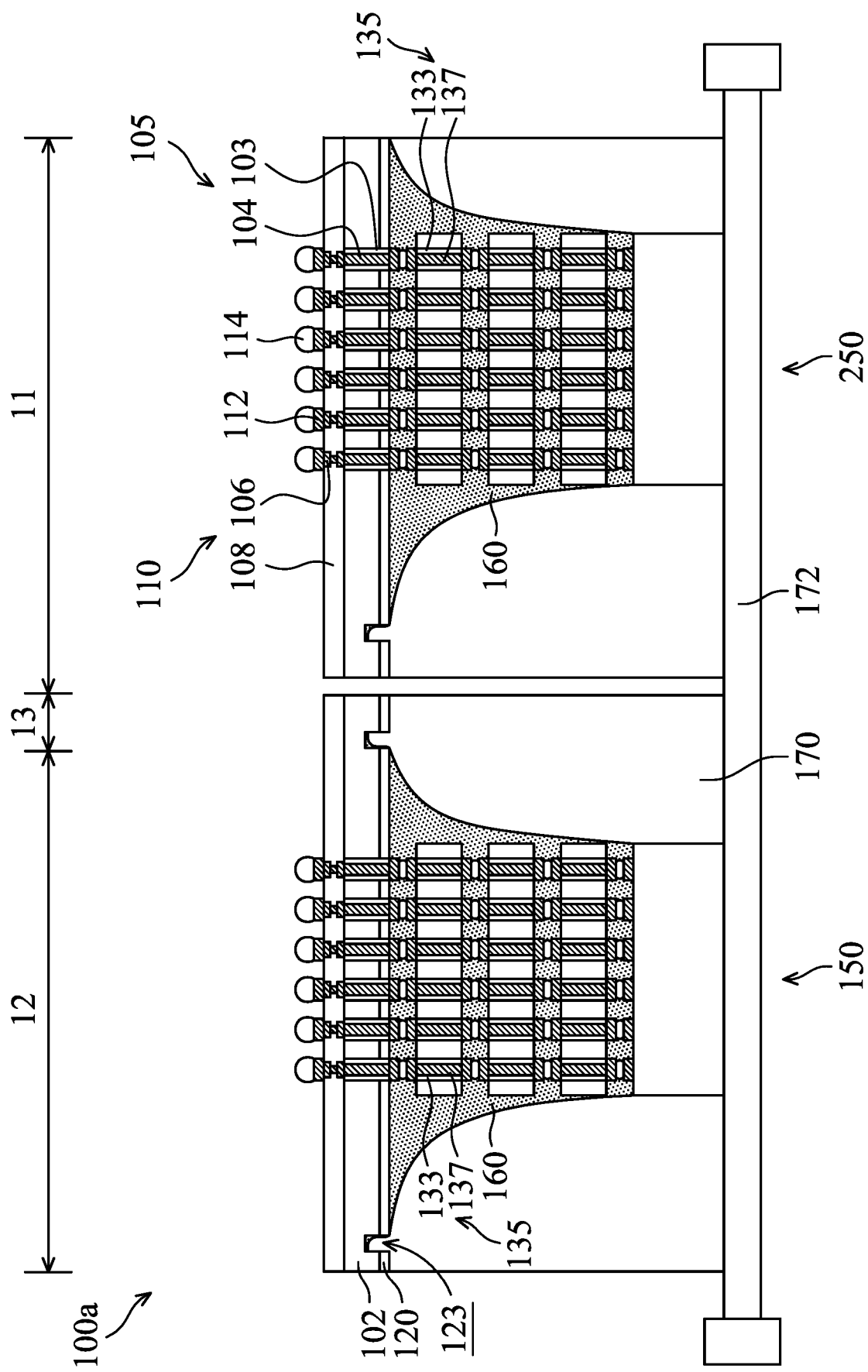

Afterwards, as shown in FIG. 1L, the carrier substrate 118 and the protection glue 119 are removed, and the first stacked die package structure 150 and the second stacked die package structure 250 are turned upside down and placed over a frame tape 172, in accordance with some embodiments of the disclosure. Subsequently, a singulation process is performed to separate the wafer-level package structure into multiple die-level package structure. In some embodiments, the singulation process is a dicing process. In some embodiments, the dicing process is performed along the scribe line region 13.

The frame tape 172 is used as a temporary substrate. The frame tape 172 substrate provides mechanical and structural support during subsequent processing steps, such as those described in more detail later.

Figure 1M:
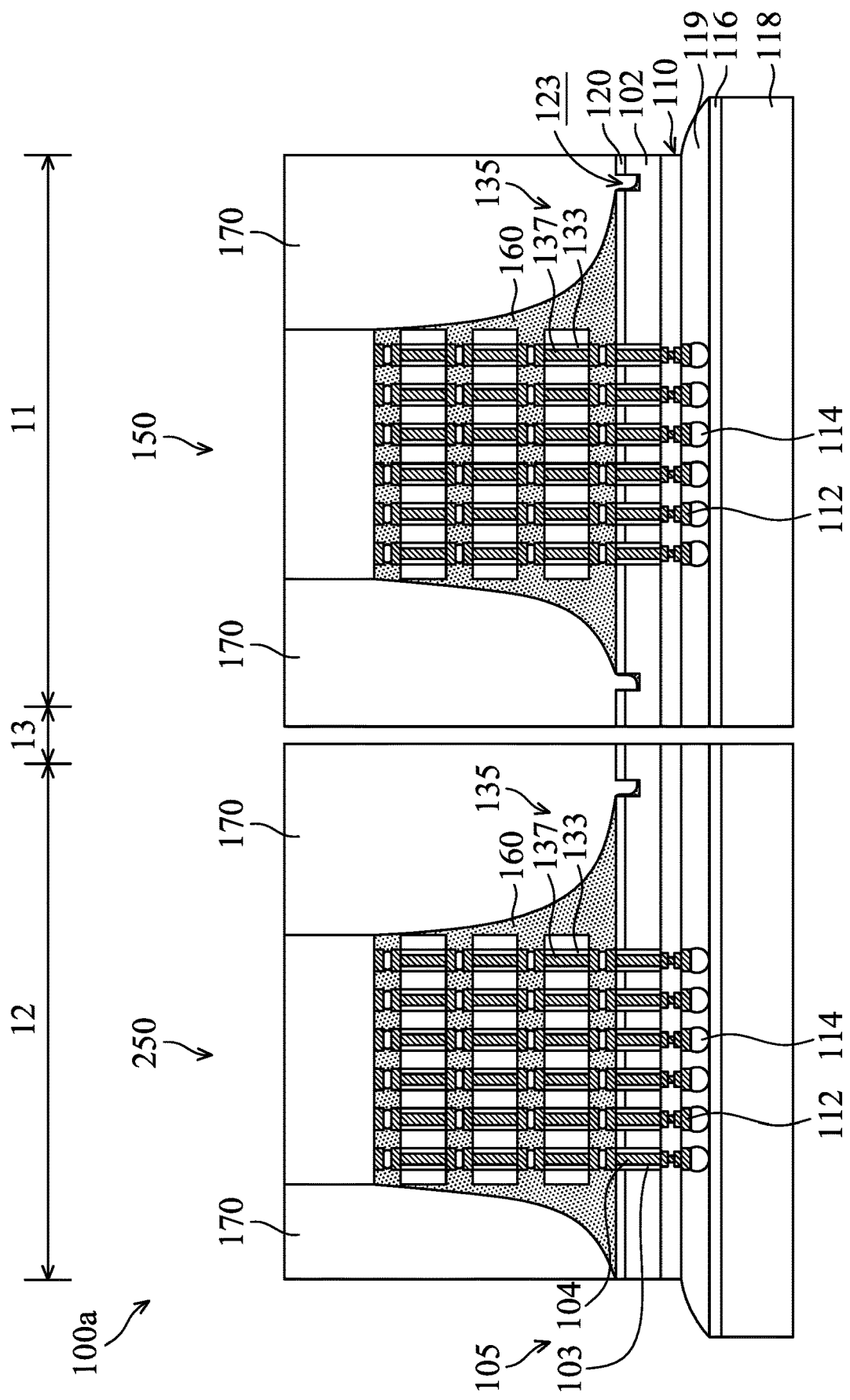

Next, as shown in FIG. 1M, the frame tape 172 is removed, and the multiple die-level package structures are obtained. The interconnect structure 110 is formed over the front surface 102a of the substrate 102, and the passivation layer 120 is formed over the back surface 102b of the substrate 102.

The first stacked die package structure 150 is formed over the back surface 102b of the substrate 102, and the underfill layer 160 is formed over the first stacked die package structure 150. The underfill layer 160 includes a first protruding portion that extends below the top surface of the through substrate via (TSV) structure 105, and the package layer 170 includes a protruding portion that extends below the top surface of the through substrate via (TSV) structure 105.

The second stacked die package structure 250 is formed over the back surface 102b of the substrate 102, and the underfill layer 160 is formed over the second stacked die package structure 250. The underfill layer 160 includes a first protruding portion that extends below the top surface of the through substrate via (TSV) structure 105, and the package layer 170 includes a protruding portion that extends below the top surface of the through substrate via (TSV) structure 105.

It should be noted that, since the underfill material 158 flows into the first trench 123, the second trench 125 and the third trench 127, the underfill layer 160 is divided into several separated parts. The underfill layer 160 is not continuous between the first stacked die package structure 150 and the second stacked die package structure 250. Therefore, the underfill layer 160 is not accumulated in the scribe line region 13, and the shrinkage volume of the underfill layer is reduced. Therefore, the warpage of the package structure 110a caused by thermal expansion mismatch can be reduced.

Figure 2A:
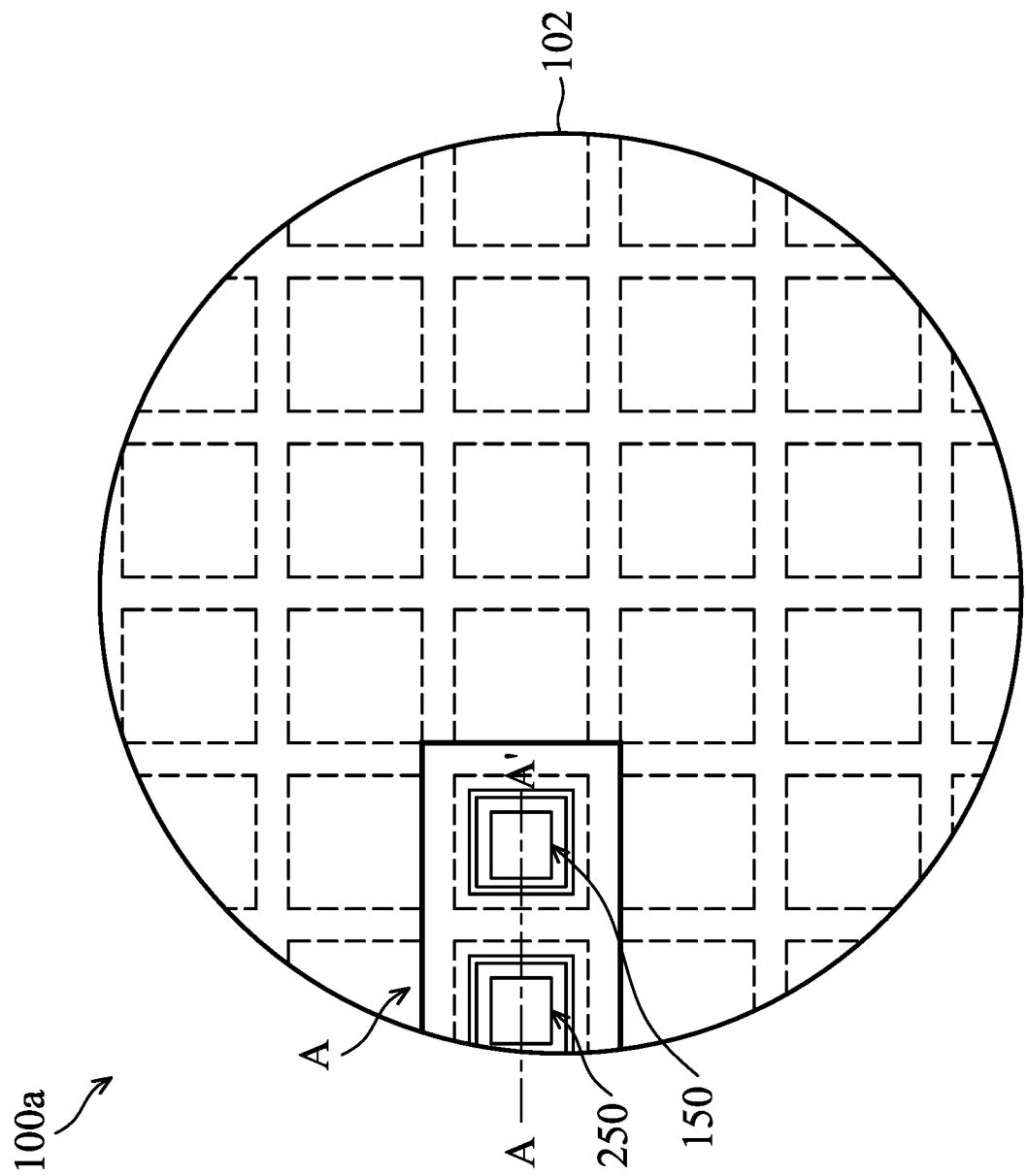
FIG. 2A shows a top view of the package structure, in accordance with some embodiments of the disclosure.
Figure 2B:
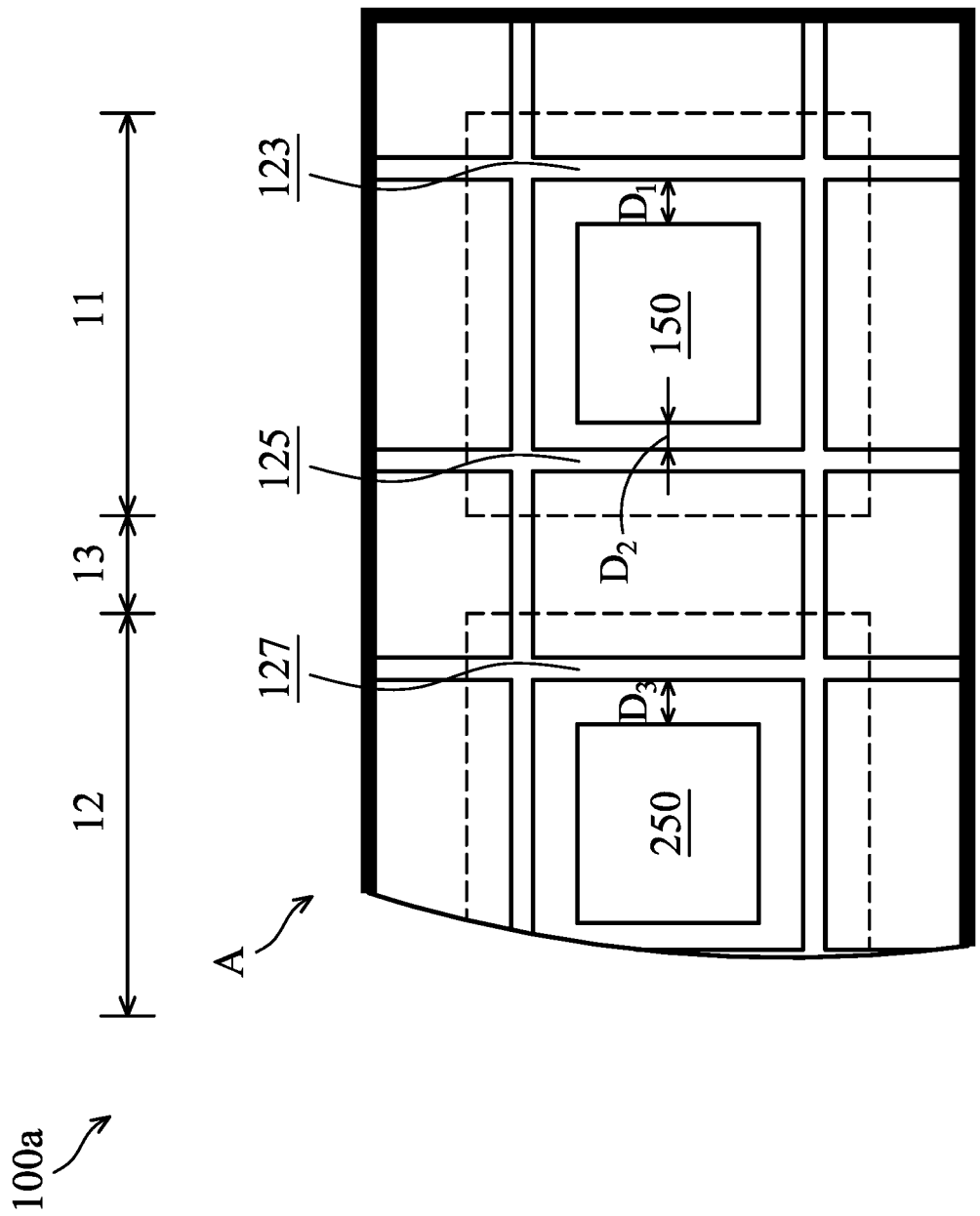
FIGS. 2B-2C shows an enlarged cross-sectional representation of region A of FIG. 2A, in accordance with some embodiments of the disclosure.
Figure 2C:
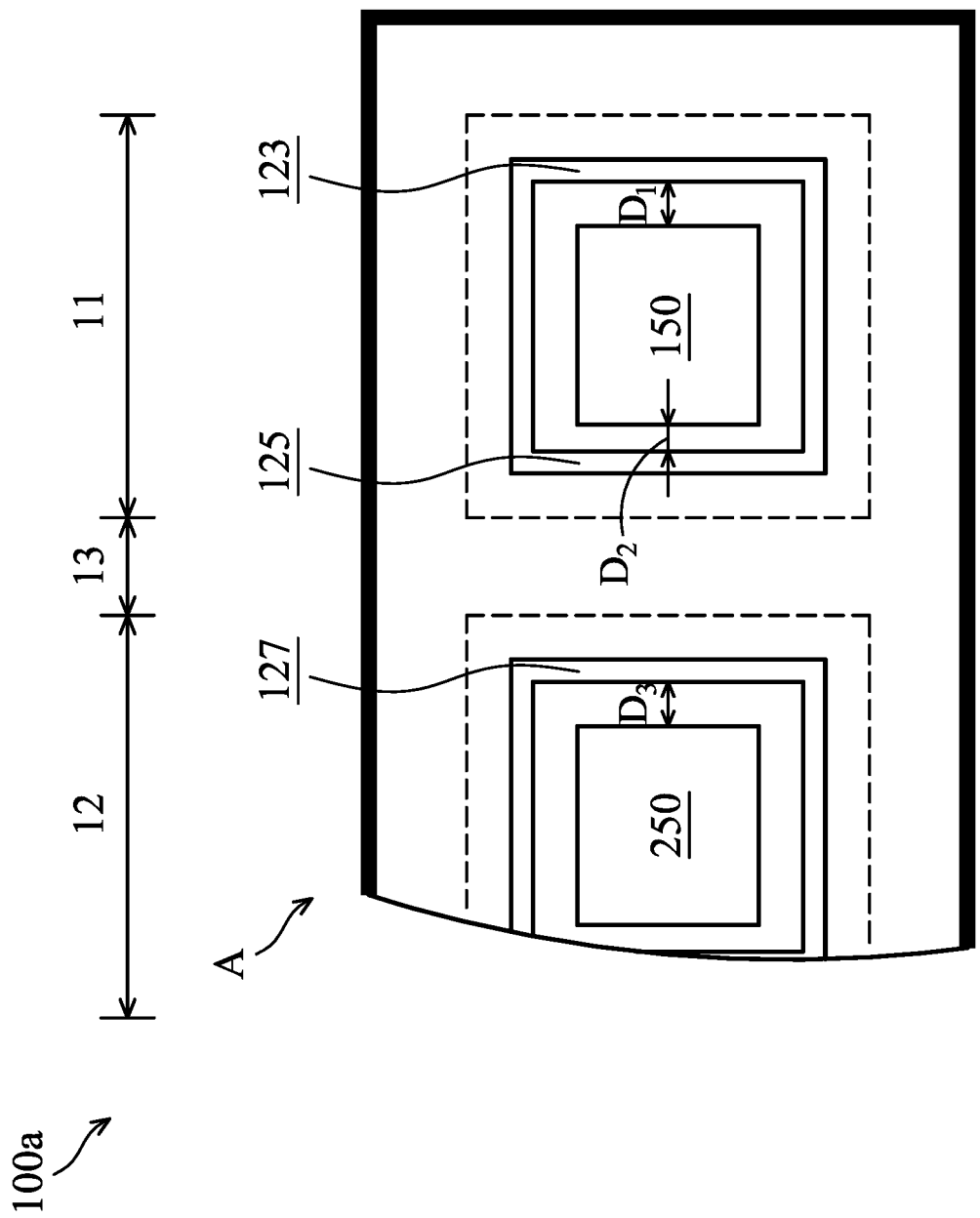

FIG. 2A shows a top view of the package structure 100a, in accordance with some embodiments of the disclosure. FIGS. 2B-2C show enlarged cross-sectional representations of region A of FIG. 2A, in accordance with some embodiments of the disclosure. FIG. 1H show cross-sectional representation taken along line A-A' of FIG. 2A.

As shown in FIG. 2B, in the first die region 11, the first trench 123 and the second trench 125 are formed on opposite sides of the first stacked die package structure 150. The first trench 123 is parallel to the second trench 125, and first trench 123 is connected to the second trench 125 by other trenches. Therefore, a ring-shaped trench structure is formed to surround the first stacked die package structure 150.

In the second die region 12, the third trench 127 located on one side of the second stacked die package structure 250. A U-shaped trench structure is formed to surround the second stacked die package structure 250.

As shown in FIG. 2C, in the first die region 11, a ring-shaped structure including the first trench 123 and the second trench 125 surrounds the first stacked die package structure 150. In the second die region 12, the third trench 127 surrounds the second stacked die package structure 250.

Figure 3A:
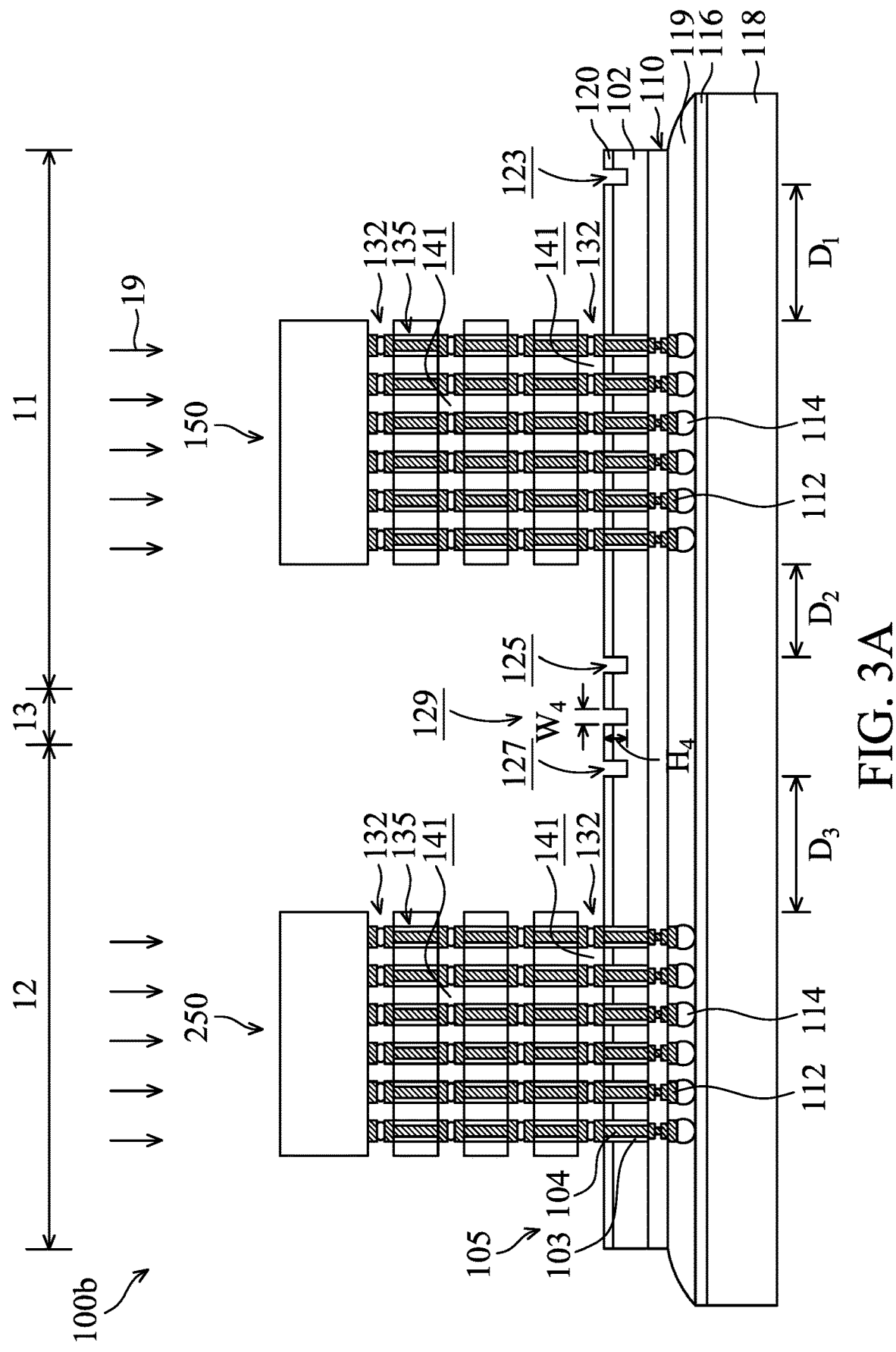
FIGS. 3A-3B show cross-sectional representations of various stages of forming a package structure, in accordance with some embodiments of the disclosure.
Figure 3B:
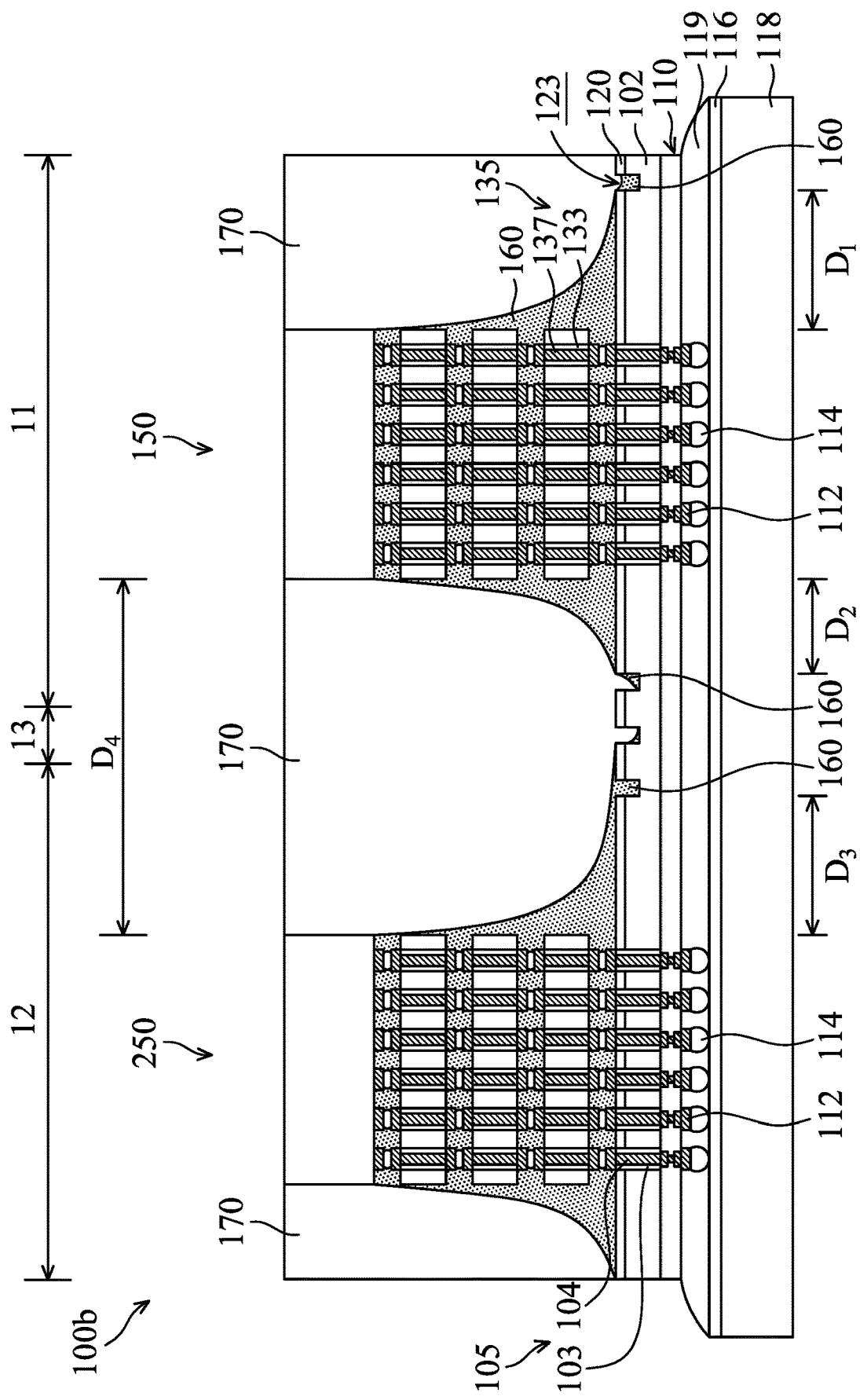

FIGS. 3A-3B show cross-sectional representations of various stages of forming a package structure 100b, in accordance with some embodiments of the disclosure. The package structure 100b is similar to, or the same as, the package structure 100a shown in FIG. 1H, except that a fourth trench 129 is formed in the scribe line region 13. Processes and materials used to form semiconductor device structure 100b may be similar to, or the same as, those used to form the semiconductor device structure 100a and are not repeated herein.

The fourth trench 129 has a fourth width $W_4$ in a horizontal direction and a fourth depth $H_4$ in a vertical direction. In some embodiments, the fourth width is in a range from about 50 μm to about 100 μm. In some embodiments, the fourth depth $H_4$ independently is in a range from about 4 μm to about 6 μm.

Afterwards, as shown in FIG. 3B, in the second die region 12, the third trench 127 is completely filled with the underfill layer 160, but the fourth trench 129 is not completely filled with the underfill layer 160. The underfill layer 160 is formed in a bottom portion of the fourth trench 129, and the package layer 170 is formed in a top portion of the fourth trench 129. In the first die region 11, in some embodiments, the underfill layer 160 occupies about 80% of the first trench 123, and the package layer occupies about 20% of the first trench 123. In some embodiments, the underfill layer 160 occupies about 20% of the second trench 125, and the package layer occupies about 80% of the second trench 125. Afterwards, the structure of FIG. 3B continues to proceed the steps of FIGS. 1L-1M.

Figure 4A:
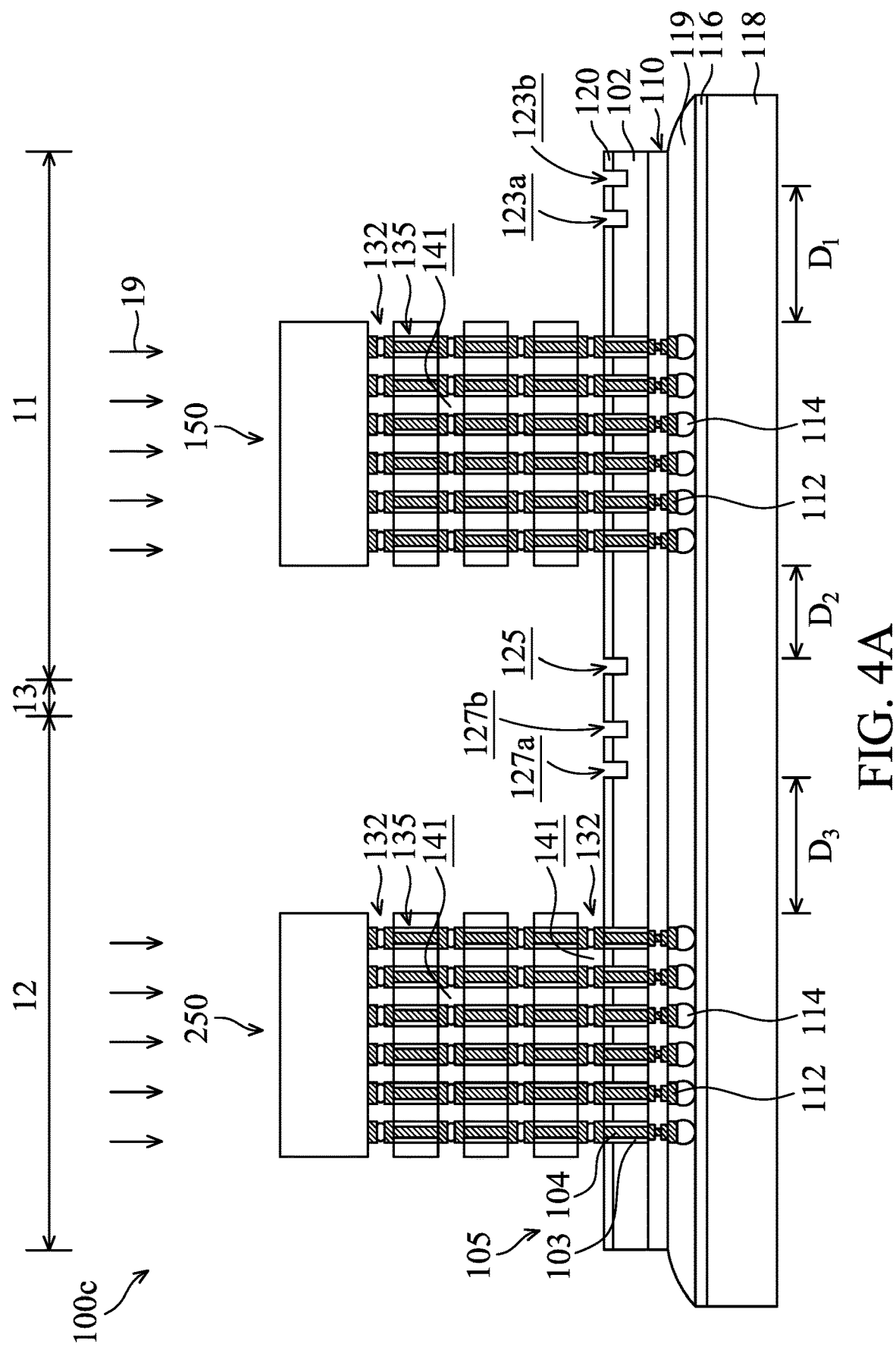
FIGS. 4A-4B show cross-sectional representations of various stages of forming a package structure, in accordance with some embodiments of the disclosure.
Figure 4B:
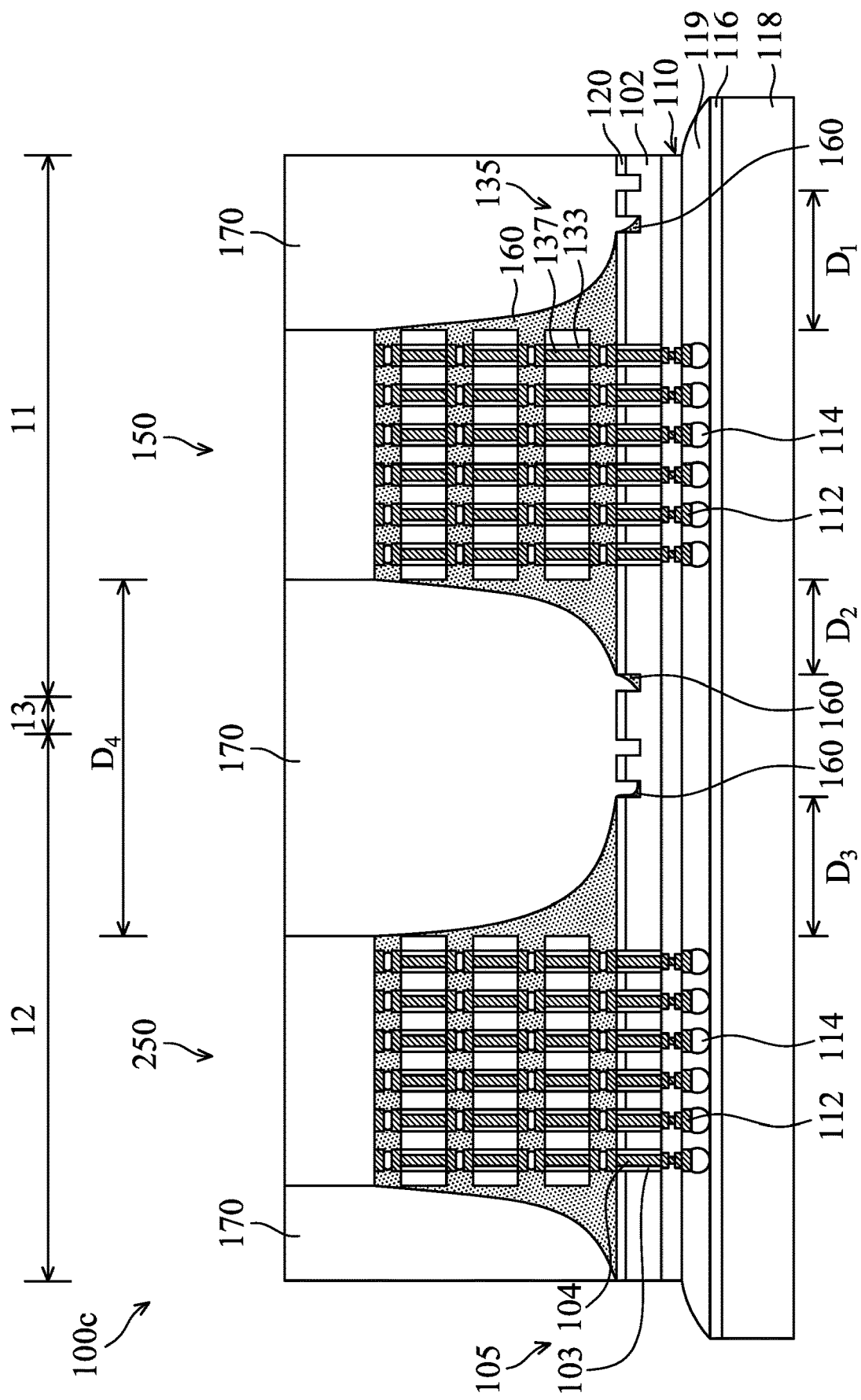

FIGS. 4A-4B show cross-sectional representations of various stages of forming a package structure 100c, in accordance with some embodiments of the disclosure. The package structure 100c is similar to, or the same as, the package structure 100a shown in FIG. 1H, except that there are two first trenches 123a, 123b located at the first side of the first stacked die package structure 150, and there are two third trenches 127a, 127b located at the first side of the second stacked die package structure 250. The first strip of first trench is marked as 123a, and the second strip of the first trench is marked as 123b. In addition, the first strip of the third trench is marked as 127a, and the second strip of the third trench is marked as 127b.

Processes and materials used to form semiconductor device structure 100c may be similar to, or the same as, those used to form the semiconductor device structure 100a and are not repeated herein. It should be noted that the number of first trench 123, the number of second trench 125 or the number of third trench 127 can be adjusted according to actual application.

Next, as shown in FIG. 4B, in the first die region 11, the first strip of the first trench 123a is closer to the first stacked die package structure 150 than the second strip of the first trench 123b. The second strip of the first trench 123b is farther away from the first stacked die package structure 150 than the first strip of the first trench 123a. The underfill layer 160 may occupy half of the first strip of the first trench 123a, and the package layer 170 may occupy half of the first strip of the first trench 123a. The underfill layer 160 does not flow into the second strip of the first trench 123b, and the second strip of the first trench 123b is completely filled with the package layer 170.

In the second die region 12, the first strip of the third trench 127a is closer to the second stacked die package structure 250 than the second strip of the third trench 127b. The underfill layer 160 may occupy half of the first strip of the third trench 127a, but the underfill layer 160 does not flow into the second strip of the third trench 127b. Afterwards, the structure of FIG. 4B continues to proceed the steps of FIGS. 1L-1M.

Figure 5A:
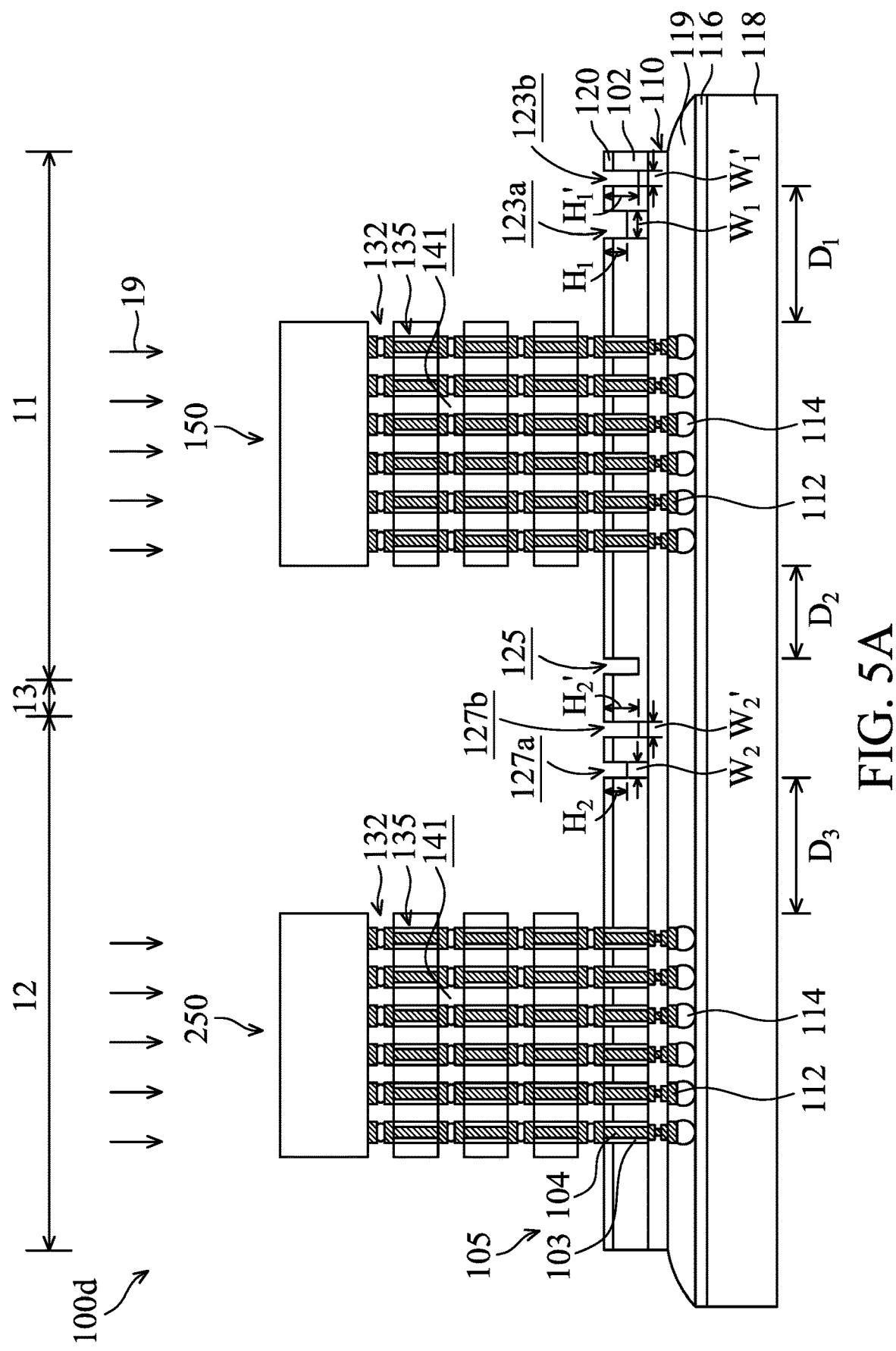
FIGS. 5A-5B show cross-sectional representations of various stages of forming a package structure, in accordance with some embodiments of the disclosure.
Figure 5B:
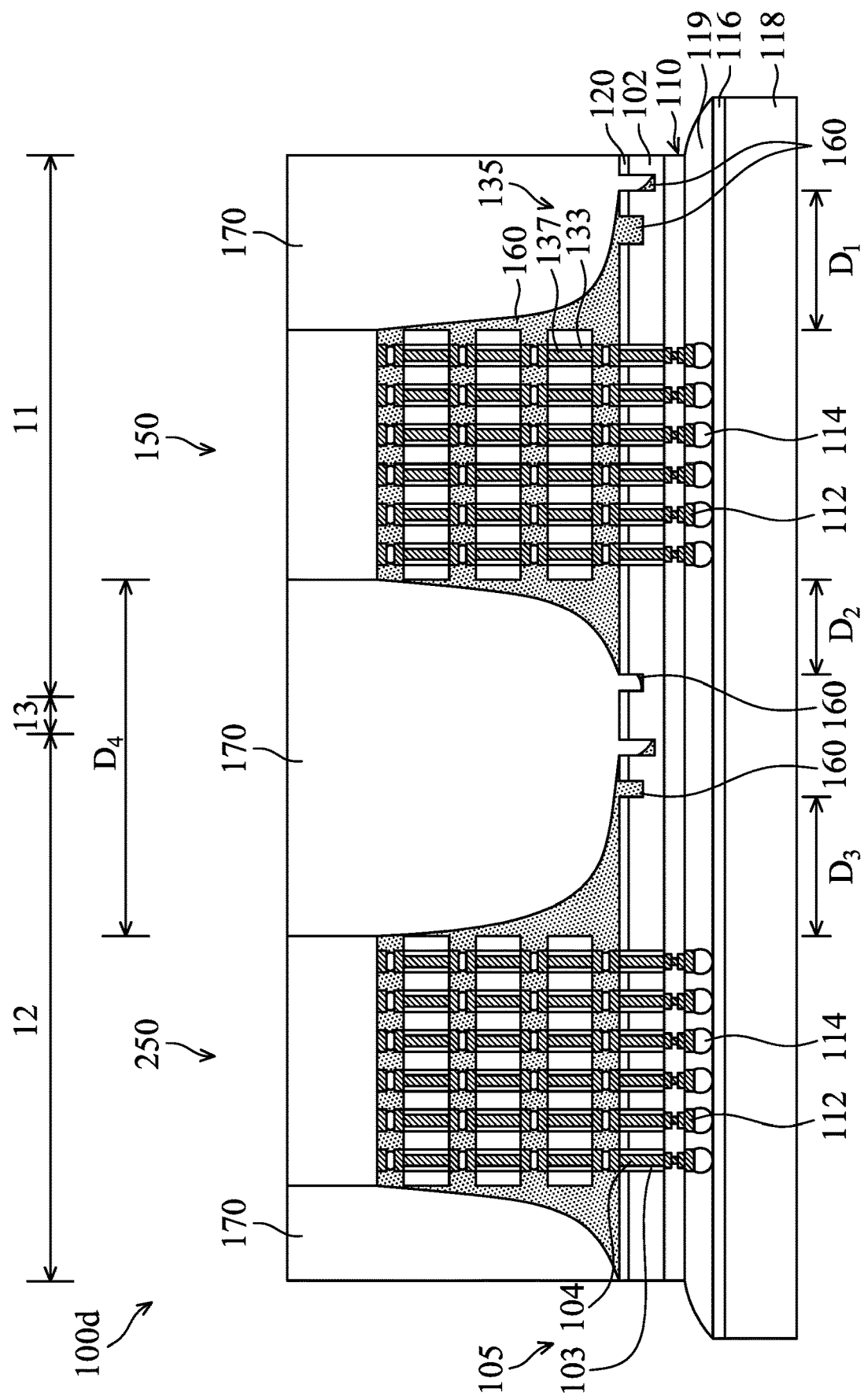

FIGS. 5A-5B show cross-sectional representations of various stages of forming a package structure 100d, in accordance with some embodiments of the disclosure. The package structure 100d is similar to, or the same as, the package structure 100c shown in FIG. 4A, except that the second strip of the first trench 123b is deeper than and narrower than the first strip of the first trench 123a, and the second strip of the third trench 127b is deeper than and narrower than the first strip of the third trench 127a. More specifically, the bottom surface of the second strip of the first trench 123b is lower than the bottom surface of the first strip of the first trench 123a.

In some other embodiments, the first strip of the first trench 123a is deeper than and narrower than the second strip of the first trench 123b. In some other embodiments, the first strip of the third trench 127a is deeper than and narrower than the second strip of the third trench 127b. The second strip of the first trench 123b has a first width $W_1'$ in a horizontal direction and a first depth $H_1'$ in a vertical direction. The second strip of the second trench 125b has a second width $W_2'$ in a horizontal direction and a second depth $H_2'$ in a vertical direction.

Processes and materials used to form semiconductor device structure 100d may be similar to, or the same as, those used to form the semiconductor device structure 100a and are not repeated herein.

Next, as shown in FIG. 5B, in the first die region 11, the first strip of the first trench 123a is completely filled with the underfill layer 160 and the underfill layer 160 flows into a bottom portion of the second strip of the first trench 123b. The top portion of the second strip of the first trench 123b is filled with the package layer 170. In the first die region 11, the underfill layer 160 has a first protruding portion (in the first strip of the first trench 123a) and a second protruding portion (in the second strip of the first trench 123b) extended below the top surface of the TSV structure 105. The second protruding portion is farther away from the top surface of the TSV structure 105 than the first protruding portion.

In addition, in the second die region 12, the first strip of the third trench 127a is completely filled with the underfill layer 160 and the underfill layer 160 continues to flow into a bottom portion of the second strip of the third trench 127b. Afterwards, the structure of FIG. 5B continues to proceed the steps of FIGS. 1L-1M.

Figure 6A:
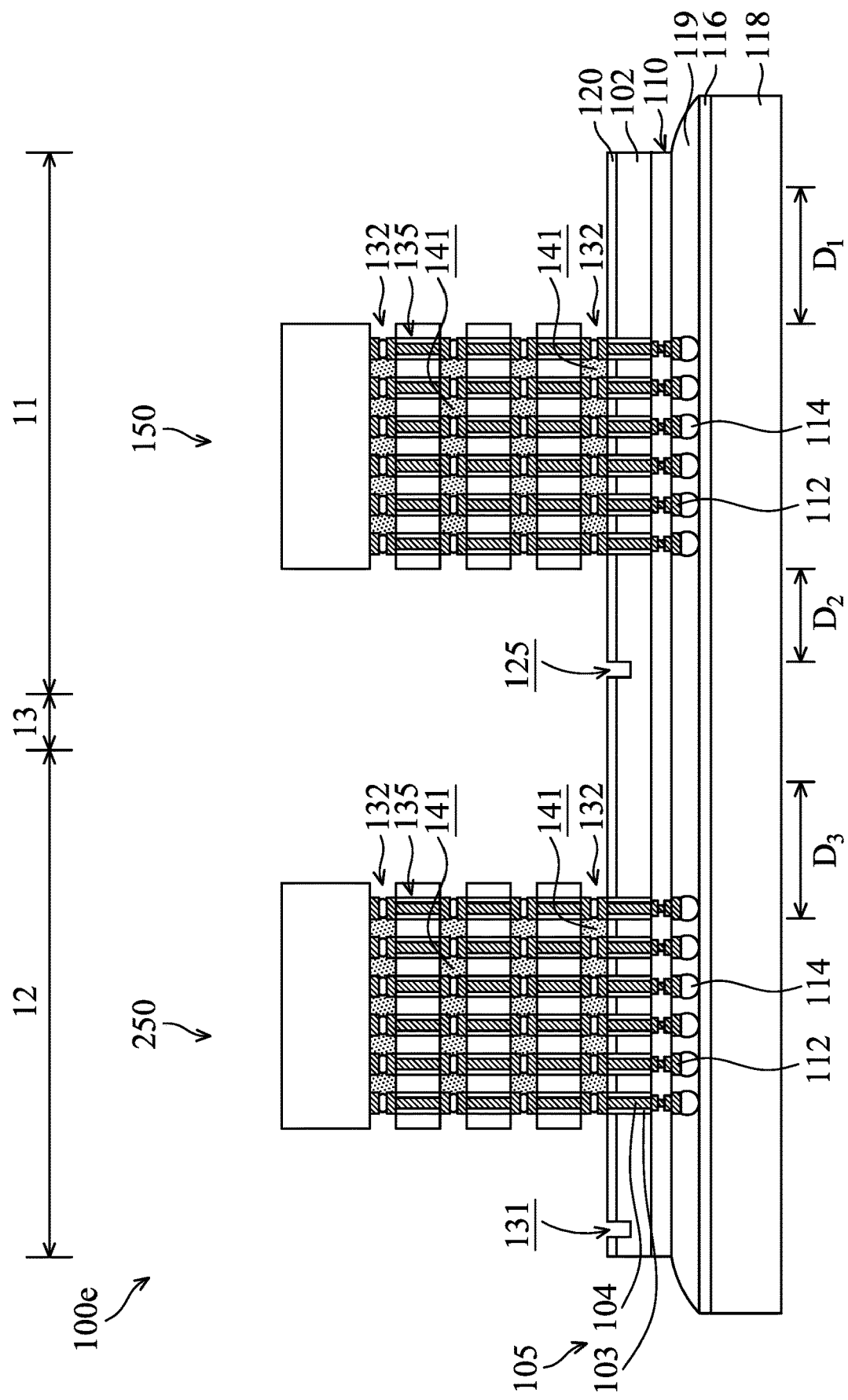
FIGS. 6A-6B show cross-sectional representations of various stages of forming a package structure, in accordance with some embodiments of the disclosure.
Figure 6B:
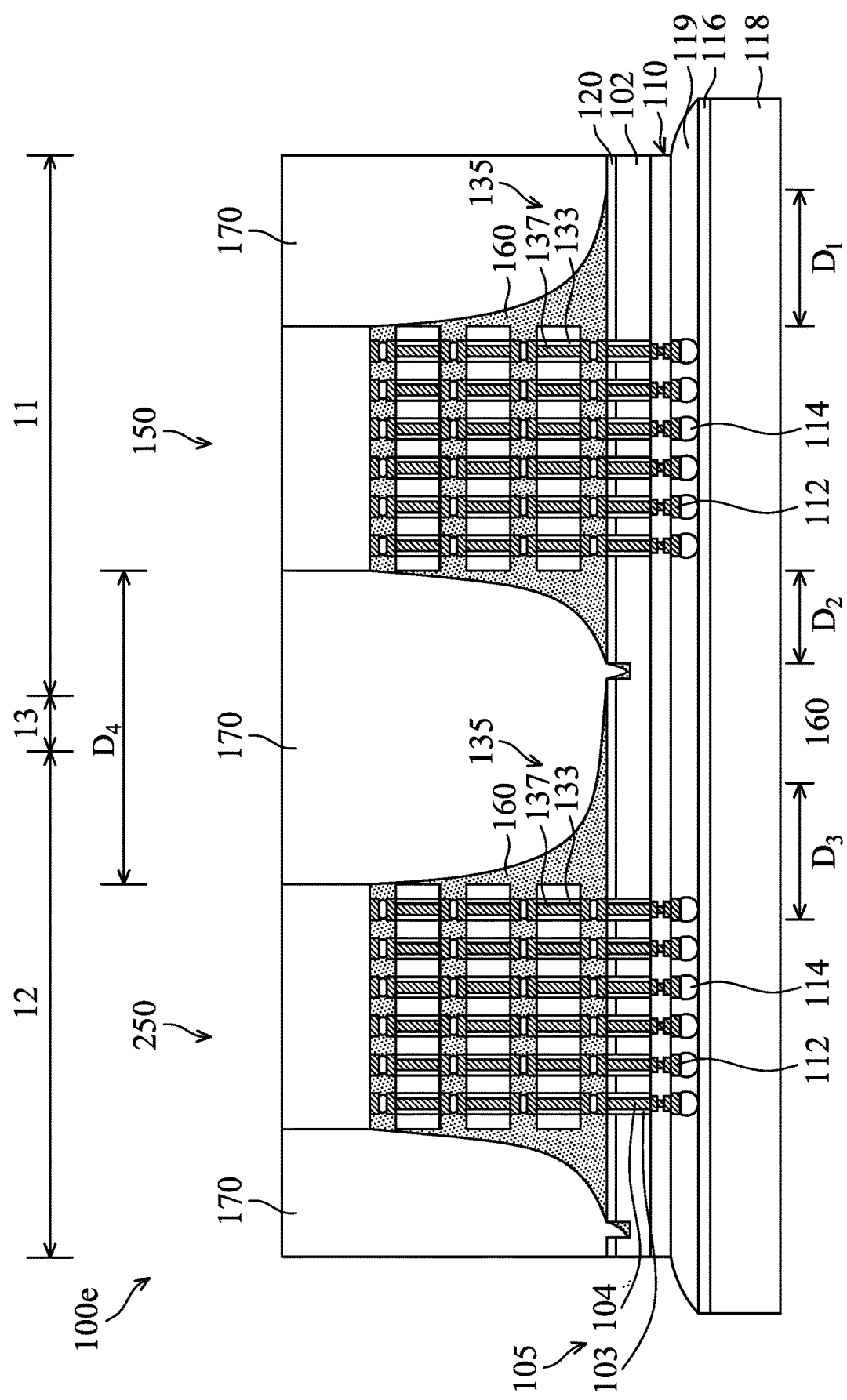

FIGS. 6A-6B show cross-sectional representations of various stages of forming a package structure 100e, in accordance with some embodiments of the disclosure. The package structure 100e is similar to, or the same as, the package structure 100a shown in FIG. 1H, except that the second trench 125 is formed in the first die region 11, and a fifth trench 131 is formed in the second die region 12. Processes and materials used to form semiconductor device structure 100e may be similar to, or the same as, those used to form the semiconductor device structure 100a and are not repeated herein.

Afterwards, as shown in FIG. 6B, the underfill material 158 flows from the second die region 12, cross the scribe line region 13, to the second trench 125 in the first die region 11. Afterwards, the package layer 170 is formed on the underfill layer 160. Therefore, the underfill layer 160 is divided into two discrete portions by the second trench 125. Therefore, the warpage of the package structure 100e is prevented since the underfill bridging is blocked by the second trench 125. Afterwards, the structure of FIG. 6B continues to proceed the steps of FIGS. 1L-1M.

It should be noted that the first trench 123, the second trench 125 and the third trench 127 are formed over the back surface 102b of the substrate 102. The trenches 123, 125 and 127 provide the accommodated spaces for the underfill material 158 to ensure minimum shrinkage of the underfill material 158. Therefore, the warpage problem of the package structure can be effectively reduced.

Embodiments for forming a package structure and method for formation the same are provided. The package structure includes forming a through via structure in a substrate and forming a first trench in the substrate. The memory dies are stacked on the substrate, and an underfill material is dispersed into the cavities between two adjacent memory dies. When the underfill material is dispersed into the cavities, the underfill material flows into the first trench. Afterwards, a curing process is performed on the underfill material to form the underfill layer. The underfill layer is divided into separate or discrete portions by the first trench. The shrinkage volume of the underfill layer is reduced after curing process, and the warpage problem of the package structure is further reduced. Therefore, the yield and the performance of the package structure is improved.

A package structure is provided in some embodiments. The package structure includes a through substrate via structure, a first stacked die package structure, an underfill layer, and a package layer. The through substrate via structure is formed over a substrate. The first stacked die package structure is over the through substrate via structure, wherein the first stacked die package structure comprises a plurality of memory dies. The underfill layer is over the first stacked die package structure. the package layer is over the underfill layer, wherein the package layer has a protruding portion that extends below a top surface of the through substrate via structure.

In some embodiments, the first stacked die package structure further includes a plurality of bonding structures between two adjacent memory dies and a plurality of through substrate via structures formed in each of the memory dies. Each of the through substrate via structures of the memory dies is electrically connected to the corresponding through substrate via structure of the substrate. In some embodiments, the package structure further includes a first trench formed on the substrate, the first trench has a ring-shaped structure or a U-shaped structure in a top view. In some embodiments, the second protruding portion is in contact with the underfill layer. In some embodiments, the package structure further includes a first trench formed on the substrate. The first trench includes a first strip and a second strip, the second strip is farther away from the first stacked die package structure than the first strip, the underfill layer is disposed in the first strip but not disposed in the second strip. In some embodiments, the package layer partially fills the first strip, and completely fills the second strip. In some embodiments, the second strip is deeper than and narrower than the first strip. In some embodiments, the package structure further includes a first trench formed on the substrate. The first trench includes first strip and a second strip, the second strip is farther away from the first stacked die package structure than the first strip, the underfill layer completely fills the first strip and partially fills the second strip.

A package structure is provided in some embodiments. The package structure includes a substrate, a through substrate via structure disposed in the substrate, a first trench formed on the substrate, a first stacked die package structure stacked over the substrate, and a package layer disposed over the first stacked die package structure, wherein the package layer is formed in the first trench.

In some embodiments, the package structure further includes a passivation layer formed over the through substrate via structure and the substrate. The through substrate via structure protrudes from a top surface of the substrate, and a portion of the through substrate via structure is exposed from the passivation layer. In some embodiments, the package structure further includes a first connector formed on the through substrate via structure, and a second connector formed below the first stacked die package structure. The first connector and the second connector are bonded to form one of the bonding structures. In some embodiments, the package structure further includes a second trench formed on the substrate. The second trench is farther away from the first stacked die package structure than the first trench, and the package layer is formed in the second trench. A first bottom surface of the package layer over the first trench is higher than a second bottom surface of the package layer in the second trench. In some embodiments, the second trench is deeper than the first trench. In some embodiments, the package structure further includes a second trench formed on the substrate, wherein a first distance between a first sidewall of the first stacked die package structure and the first trench is greater than a second distance between a second sidewall of the first stacked die package structure and the second trench. In some embodiments, the package structure further includes an interconnect structure formed on a front surface of the substrate, wherein the through substrate via structure is formed on a back surface of the substrate, and the first trench is formed on the back surface of the substrate.

A package structure is provided in some embodiments. The package structure includes a substrate, a first stacked die package structure stacked over the substrate, a first trench formed in the substrate, an underfill layer formed in the first trench, and a package layer formed on the underfill layer, wherein the underfill layer is in contact with the package layer in the first trench.

In some embodiments, the first stacked die package structure includes a plurality of first dies, the package structure further includes a plurality of through substrate via structures formed in the first dies, wherein each of the plurality of through substrate via structures includes a conductive structure and a barrier layer surrounding the conductive structure. In some embodiments, the package structure further includes a second trench formed in the substrate, wherein the first trench and the second trench are filled by the underfill layer, and a first height of the underfill layer in the first trench is different from a second height of the underfill layer in the second trench. In some embodiments, the package structure further includes a second trench formed in the substrate, wherein a first distance between the first stacked die package structure and the first trench is greater than a second distance between the first stacked die package structure and the second trench. In some embodiments, the first trench is deeper than the second trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a through substrate via structure formed over a substrate;
   a first stacked die package structure over the through substrate via structure, wherein the first stacked die package structure comprises a plurality of memory dies;
   an underfill layer over the first stacked die package structure; and
   a package layer over the underfill layer, wherein the package layer has a protruding portion that extends below a top surface of the through substrate via structure.

2. The package structure as claimed in claim 1, wherein the first stacked die package structure further comprises:
   a plurality of bonding structures between two adjacent memory dies, and
   a plurality of through substrate via structures formed in each of the memory dies, wherein each of the through substrate via structures of the memory dies is electrically connected to the corresponding through substrate via structure of the substrate.

3. The package structure as claimed in claim 1, further comprising a first trench formed on the substrate, wherein the first trench has a ring-shaped structure or a U-shaped structure in a top view.

4. The package structure as claimed in claim 1, wherein the second protruding portion is in contact with the underfill layer.

5. The package structure as claimed in claim 1, further comprising a first trench formed on the substrate, wherein the first trench comprises a first strip and a second strip, the second strip is farther away from the first stacked die package structure than the first strip, the underfill layer is disposed in the first strip but not disposed in the second strip.

6. The package structure as claimed in claim 5, wherein the package layer partially fills the first strip, and completely fills the second strip.

7. The package structure as claimed in claim 6, wherein the second strip is deeper than and narrower than the first strip.

8. The package structure as claimed in claim 1, further comprising a first trench formed on the substrate, wherein the first trench comprises a first strip and a second strip, the second strip is farther away from the first stacked die package structure than the first strip, the underfill layer completely fills the first strip and partially fills the second strip.

9. A package structure, comprising:
   a substrate;
   a through substrate via structure disposed in the substrate;
   a first trench formed on the substrate;
   a first stacked die package structure stacked over the substrate; and
   a package layer disposed over the first stacked die package structure, wherein the package layer is formed in the first trench.

10. The package structure as claimed in claim 9, further comprising a passivation layer formed over the through substrate via structure and the substrate, wherein the through substrate via structure protrudes from a top surface of the substrate, and a portion of the through substrate via structure is exposed from the passivation layer.

11. The package structure as claimed in claim 9, further comprising:
   a first connector formed on the through substrate via structure;
   a second connector formed below the first stacked die package structure, wherein the first connector and the second connector are bonded to form one of the bonding structures.

12. The package structure as claimed in claim 9, further comprising a second trench formed on the substrate, wherein the second trench is farther away from the first stacked die package structure than the first trench, and the package layer is formed in the second trench, wherein a first bottom surface of the package layer over the first trench is higher than a second bottom surface of the package layer in the second trench.

13. The package structure as claimed in claim 12, wherein the second trench is deeper than the first trench.

14. The package structure as claimed in claim 9, further comprising a second trench formed on the substrate, wherein a first distance between a first sidewall of the first stacked die package structure and the first trench is greater than a second distance between a second sidewall of the first stacked die package structure and the second trench.

15. The package structure as claimed in claim 9, further comprising an interconnect structure formed on a front surface of the substrate, wherein the through substrate via structure is formed on a back surface of the substrate, and the first trench is formed on the back surface of the substrate.

16. A package structure, comprising:
a substrate;
a first stacked die package structure stacked over the substrate;
a first trench formed in the substrate;
an underfill layer formed in the first trench; and
a package layer formed on the underfill layer, wherein the underfill layer is in contact with the package layer in the first trench.

17. The package structure as claimed in claim 16, wherein the first stacked die package structure comprises a plurality of first dies, the package structure further comprises a plurality of through substrate via structures formed in the first dies, wherein each of the plurality of through substrate via structures comprises a conductive structure and a barrier layer surrounding the conductive structure.

18. The package structure as claimed in claim 16, further comprising a second trench formed in the substrate, wherein the first trench and the second trench are filled by the underfill layer, and a first height of the underfill layer in the first trench is different from a second height of the underfill layer in the second trench.

19. The package structure as claimed in claim 16, further comprising a second trench formed in the substrate, wherein a first distance between the first stacked die package structure and the first trench is greater than a second distance between the first stacked die package structure and the second trench.

20. The package structure as claimed in claim 19, wherein the first trench is deeper than the second trench.

* * * * *